(12) United States Patent
Shiota et al.

(10) Patent No.: US 7,072,232 B2
(45) Date of Patent: Jul. 4, 2006

(54) NONVOLATILE MEMORY SYSTEM

(75) Inventors: Shigemasa Shiota, Tachikawa (JP);
Hiroyuki Goto, Higashimurayama (JP);
Hirofumi Shibuya, Matsuda (JP);
Fumio Hara, Higashikurume (JP)

(73) Assignee: Renesas Technology Corp., Tokyo (JP)

( * ) Notice: Subject to any disclaimer, the term of this patent is extended or adjusted under 35 U.S.C. 154(b) by 108 days.

(21) Appl. No.: 10/753,527

(22) Filed: Jan. 9, 2004

(65) Prior Publication Data
US 2004/0158778 A1     Aug. 12, 2004

(30) Foreign Application Priority Data
Feb. 7, 2003     (JP)     ............................. 2003-030694

(51) Int. Cl.
*G11C 7/00*     (2006.01)
(52) U.S. Cl. ..................................... 365/191
(58) Field of Classification Search ................. 365/191
See application file for complete search history.

(56) References Cited

U.S. PATENT DOCUMENTS 5,473,770 A * 12/1995 Vrba ........................... 365/222
6,715,041 B1 * 3/2004 Avraham ............... 365/185.33
6,813,191 B1 * 11/2004 Fujioka ................. 365/185.29

FOREIGN PATENT DOCUMENTS

JP     2001-334243     10/2001

* cited by examiner

*Primary Examiner*—Thong Q. Le
(74) *Attorney, Agent, or Firm*—Miles & Stockbridge P.C.

(57) ABSTRACT

The invention is directed to largely improve reliability by surely protecting data on the basis of an emergency stop request even during a data transfer process. The invention provides a data memory system taking the form of a memory card or the like. When an emergency stop signal requesting an emergency stop is received from an information processor of a host during a read/write data transfer process, a control circuit immediately stops the transfer process and notifies the information processor of end of the read data transfer. At this time, the end of read data transfer is notified irrespective of whether the transfer is finished normally or abnormally. Even when a read data transfer request is received again from the information processor after notifying the information processor of the end of read data transfer, without transferring data, a controller notifies the information processor of an untransferable state of read data.

14 Claims, 31 Drawing Sheets

FIG. 30

SEMICONDUCTOR MEMORY (15)

| ADDRESS | DATA STORAGE AREA | DATA AREA FOR ERROR DETECTION |
|---|---|---|
| 0 | USER DATA (0) | DETECTION DATA (0) |
| 1 | USER DATA (1) | DETECTION DATA (1) |
| ⋮ | ⋮ | ⋮ |
| k-1 | USER DATA (k-1) | DETECTION DATA (k-1) |
| k | USER DATA (k) | DETECTION DATA (k) |
| ⋮ | ⋮ | ⋮ |
| n-1 | USER DATA (n-1) | DETECTION DATA (n-1) |
| n | TRANSFER INVALID FLAG | DETECTION DATA (n) |

FIG. 31

SEMICONDUCTOR MEMORY (15)

| ADDRESS | DATA STORAGE AREA | DATA AREA FOR ERROR DETECTION |
|---|---|---|
| 0 | USER DATA (0) | DETECTION DATA (0) |
| 1 | USER DATA (1) | DETECTION DATA (1) |
| ⋮ | ⋮ | ⋮ |
| k-1 | USER DATA (k-1) | DETECTION DATA (k-1) |
| k | USER DATA (k) | DETECTION DATA (k) |
| ⋮ | ⋮ | ⋮ |
| n-1 | USER DATA (n-1) | DETECTION DATA (n-1) |
| n | TRANSFER VALID FLAG | DETECTION DATA (n) | ns
NONVOLATILE MEMORY SYSTEM

BACKGROUND OF THE INVENTION

The present invention relates to a technique for improving reliability of a nonvolatile memory system and, more particularly, to a technique effectively applied to data protection in a memory system constructed by using a nonvolatile semiconductor memory.

As external storage media of a personal computer, a multifunctional peripheral, and the like, for example, memory systems such as a CF (Compact Flash) card, Smart media, a memory stick, and a multimedia card are widely known.

In a process of reading/writing data from/to such a memory system, at the time of storing data into the memory card, even in the case where a write error occurs, sound data and video data is not rewritten. By sequentially writing data which is received continuously, overflow of data is prevented. With respect to data such as FAT data, in the case where a write error occurs, a spare region is retrieved and data is rewritten (refer to, for example, Japanese Patent Application No. 2001-334243).

In the case where a host makes a request for reading/transferring data which is erroneous from a memory system, if the memory system has a correcting function such as an ECC (Error Correcting Code) and the erroneous data is correctable, the memory system corrects the data, rewrites the data in the memory system, and transfers the data to the host.

In the case where the data is not correctable or the memory system has an error detecting function such as a parity check, an error is notified to the host and the process is finished.

SUMMARY OF THE INVENTION

However, the inventor herein has found that the technique of reading/writing data from/to the memory system has the following problems.

For example, when an external power source voltage becomes unstable for some reason during a data reading/writing process of a host such as a personal computer, there is the possibility that erroneous reading or writing occurs.

In this case, the data reading/writing process can be interrupted by a resetting process of interrupting the data transferring process from the host to the memory system. However, after the resetting process is finished, even when the power source voltage is unstable, the host accepts the reading/writing process again. It causes a problem such that the erroneous reading/writing occurs.

In the case where an abnormal operation occurs in the host, the abnormal state of the host cannot be notified to the memory system. It causes a problem such that erroneous data is stored into the memory system by a process of rewriting erroneous data.

In the case where the memory system corrects data by using an ECC or the like, process time for data correction is long and wait time of the host becomes long, so that real-time performance may deteriorate.

At the time of transferring sound data or image data, it is necessary to transfer a large amount of data. Consequently, it may be requested to continuously transfer the data without intermission even if the data includes a small amount of erroneous data (for example, interruption of sound and noise in an image) rather than notifying an error.

An object of the invention is to provide a memory system in which data can be protected reliably on the basis of an emergency stop request even during a data transferring process and which realizes largely improved reliability.

Another object of the invention is to provide a memory system capable of determining whether error correction is performed or not in accordance with data and efficiently transferring data.

The above and other objects and novel features of the invention will become apparent from the description of the specification and the appended drawings.

An outline of representative one of inventions disclosed in the specification will be briefly described as follows.

(1) A nonvolatile memory system including one or more semiconductor memories and an information processor, wherein when an emergency stop signal is received from the outside, the information processor stops an operation being performed and enters a no-response state in which no response is given to a process request from the outside.

An outline of another invention in the specification will be briefly described.

(2) A nonvolatile memory system including one or more semiconductor memories and an information processor, wherein the information processor has a transfer mode storing unit for storing transfer function setting data for setting a transfer mode of error data, refers to the transfer function setting data in the transfer mode storing unit in a data transfer process at the time of a read/write operation and, when an error data transfer function of the transfer function setting data is set to be valid, executes a transfer process even if transfer data includes error data.

BRIEF DESCRIPTION OF THE DRAWINGS

FIG. 30 is a diagram illustrating an example of a data structure when transfer function setting data is set in a semiconductor memory provided for the data memory system according to the second embodiment of the invention.

FIG. 31 is a diagram illustrating another example of the data structure when the transfer function setting data is set in the semiconductor memory provided for the data memory system according to the second embodiment of the invention.

DETAILED DESCRIPTION OF THE PREFERRED EMBODIMENTS

Embodiments of the invention will be described in detail hereinbelow with reference to the drawings.

First Embodiment

Figure 1:
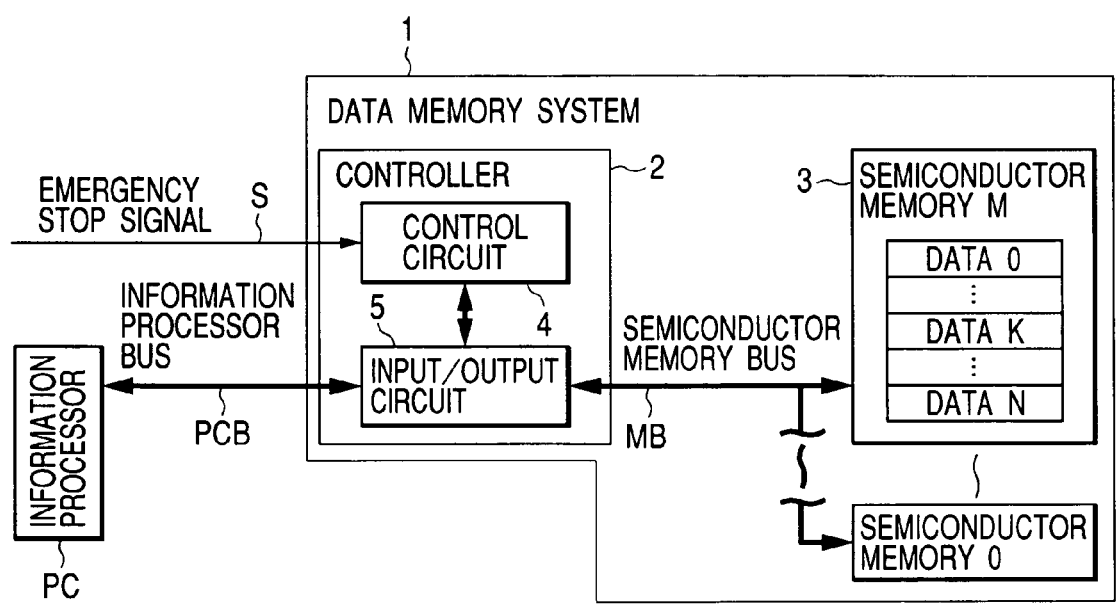
FIG. 1 is a block diagram of a data memory system according to a first embodiment of the invention.
Figure 2:
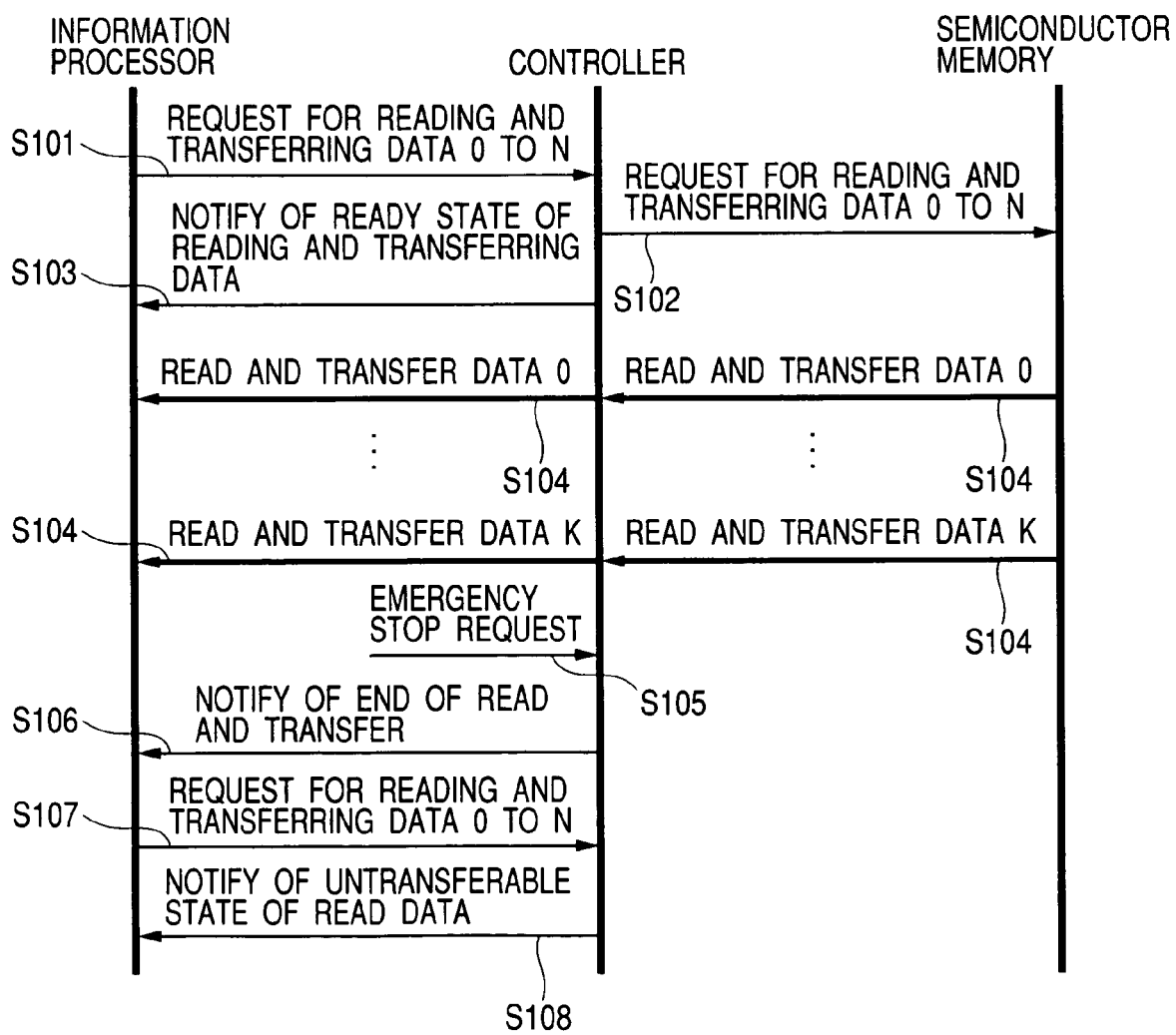
FIG. 2 is a flowchart of an emergency stop request process performed during transfer of read data in the data memory system of FIG. 1.
Figure 3:
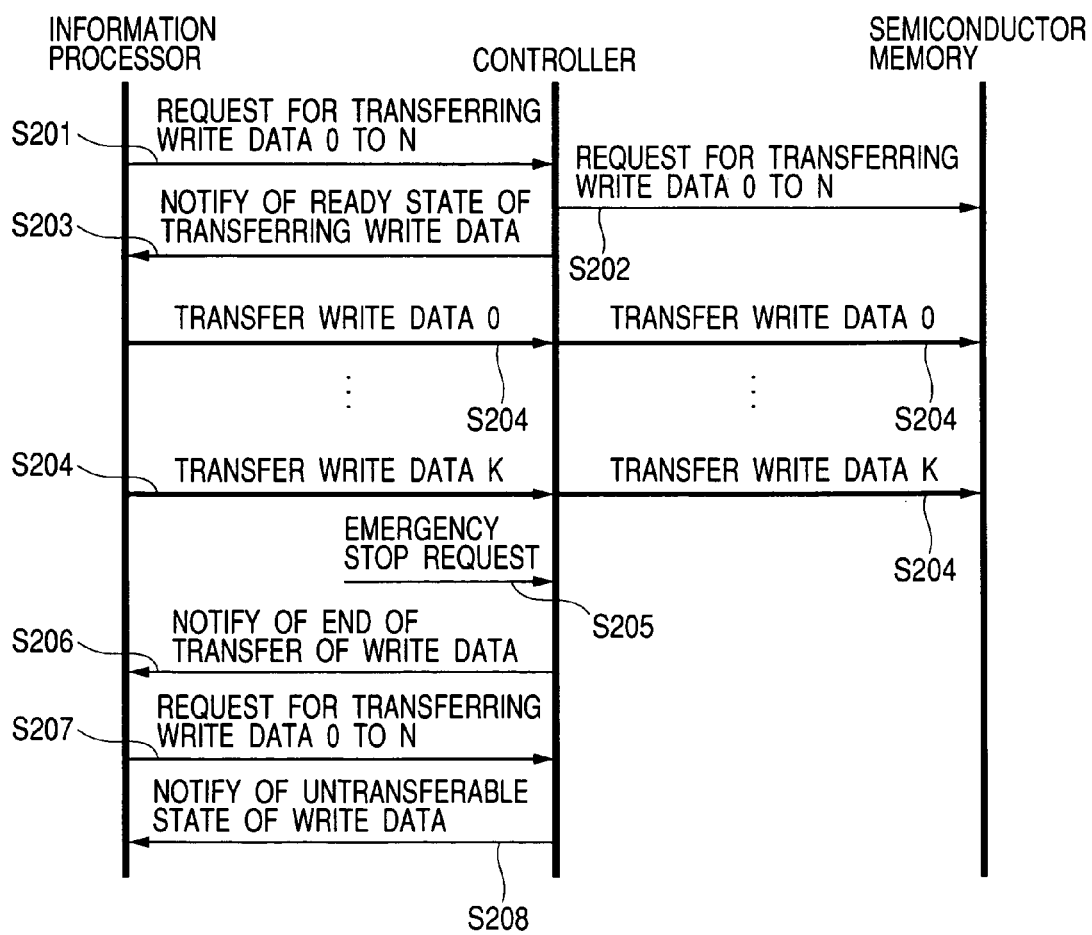
FIG. 3 is a flowchart of process performed when an emergency stop signal is issued during transfer of write data in the data memory system of FIG. 1.
Figure 4:
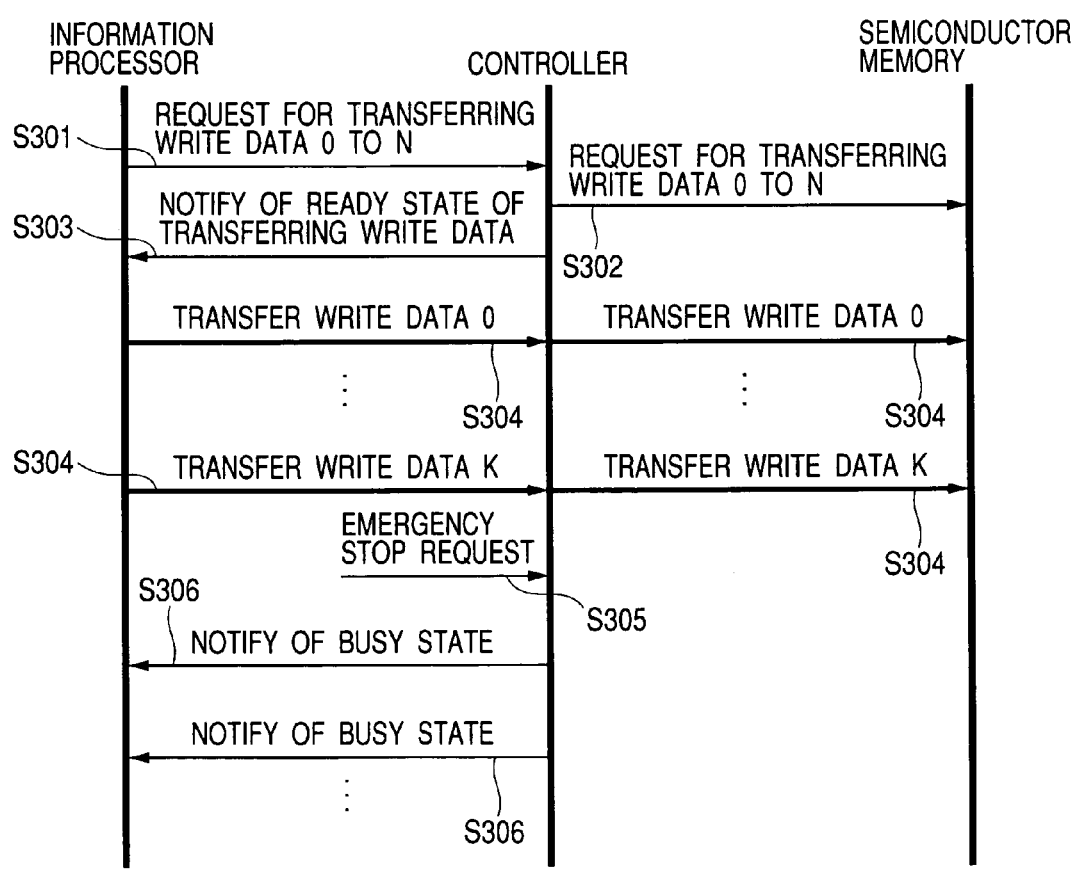
FIG. 4 is a flowchart of process performed when an emergency stop signal is issued during transfer of write data in the data memory system of FIG. 1.
Figure 5:
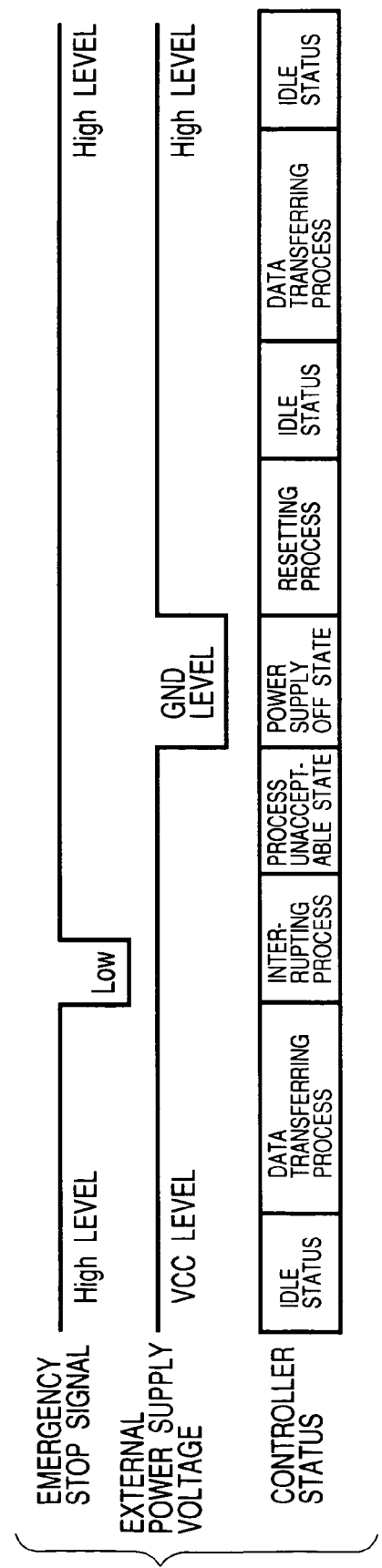
FIG. 5 is a sequence chart of a power source voltage supplied to the data memory system of FIG. 1.
Figure 6:
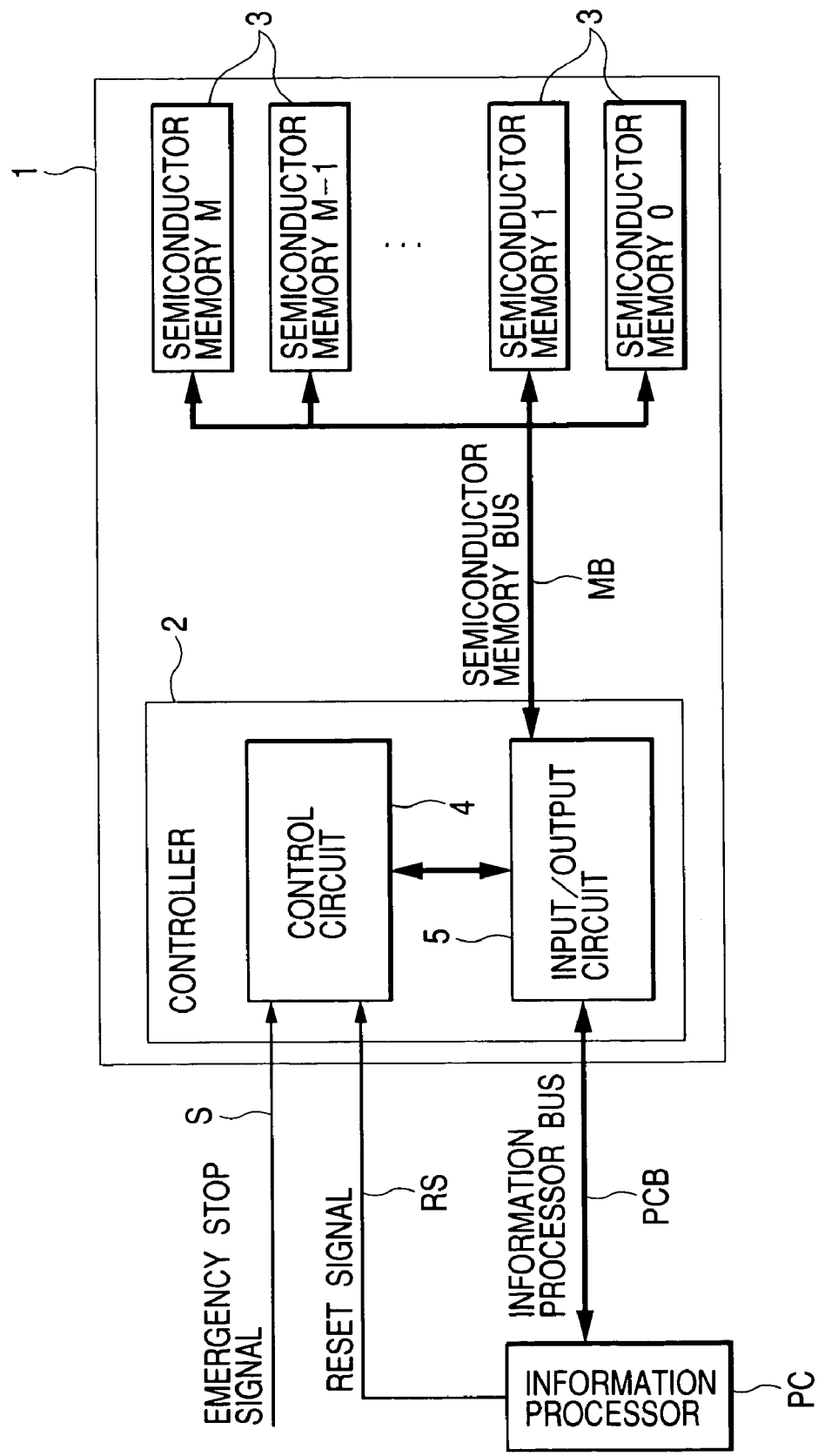
FIG. 6 is a block diagram showing an example of connection of a reset signal in the data memory system according to the first embodiment of the invention.
Figure 7:
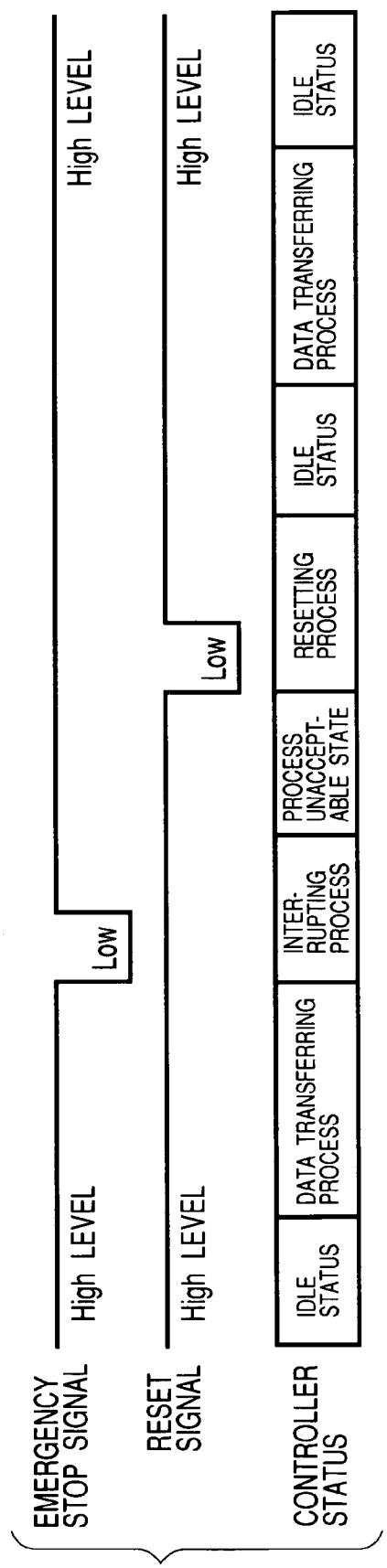
FIG. 7 is a sequence chart of the reset signal and the emergency stop signal in the data memory system of FIG. 6.
Figure 8:
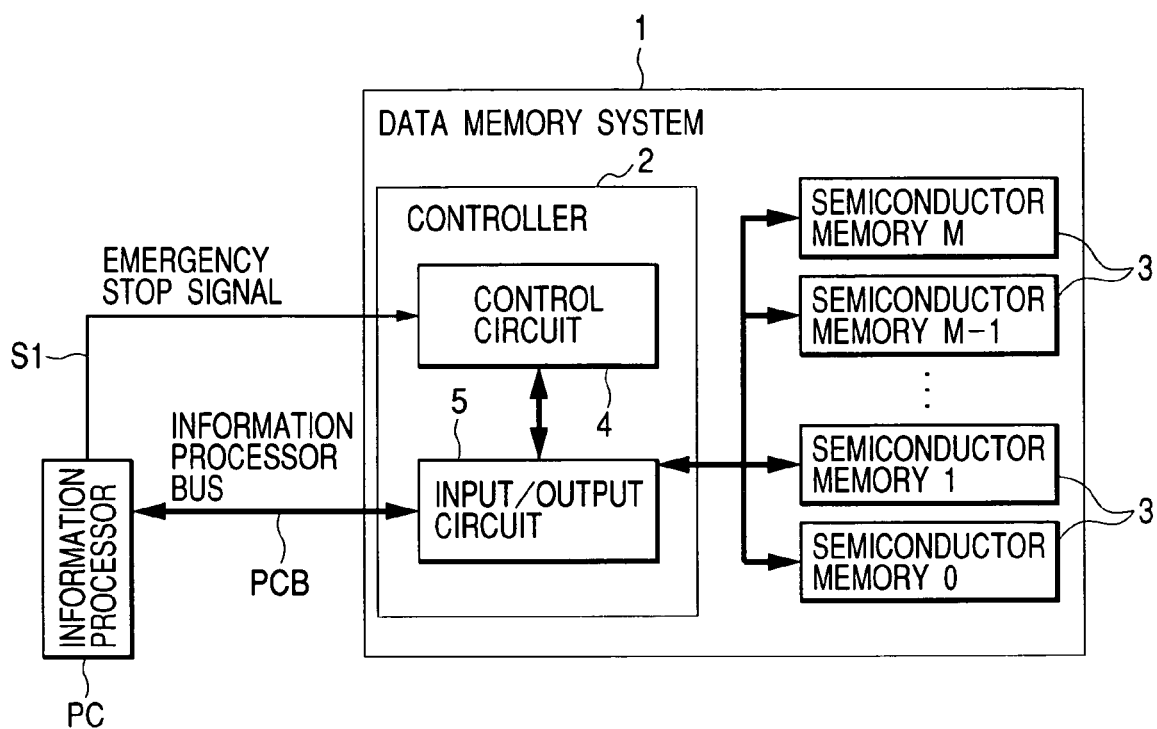
FIG. 8 is a block diagram showing another example of connection of the reset signal in the data memory system according to the first embodiment of the invention.
Figure 9:
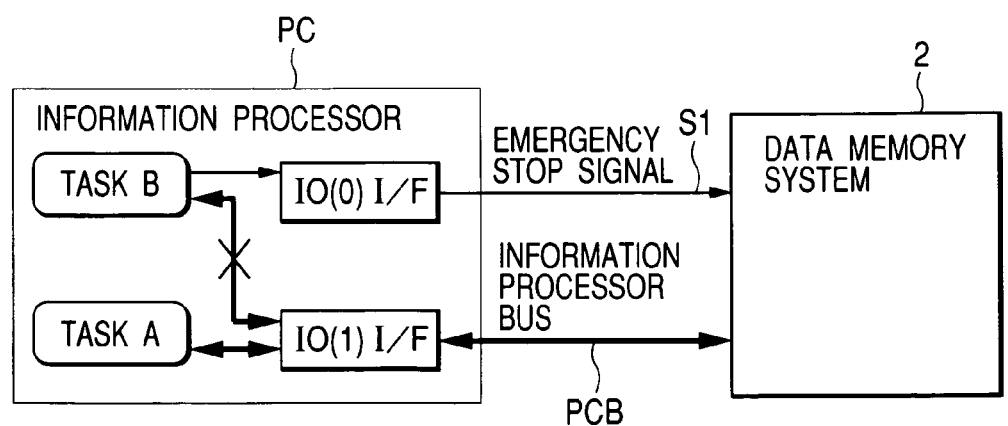
FIG. 9 is a diagram illustrating a signal process using the data memory system of FIG. 8.

FIG. 1 is a block diagram of a data memory system according to a first embodiment of the invention. FIG. 2 is a flowchart of an emergency stop request process performed during transfer of read data in the data memory system of FIG. 1. FIG. 3 is a flowchart of process performed when an emergency stop signal is issued during transfer of write data in the data memory system of FIG. 1. FIG. 4 is a flowchart of process performed when an emergency stop signal is issued during transfer of write data in the data memory system of FIG. 1. FIG. 5 is a sequence chart of a power source voltage supplied to the data memory system of FIG. 1. FIG. 6 is a block diagram showing an example of connection of a reset signal in the data memory system according to the first embodiment of the invention. FIG. 7 is a sequence chart of the reset signal and the emergency stop signal in the data memory system of FIG. 6. FIG. 8 is a block diagram showing another example of connection of the reset signal in the data memory system according to the first embodiment of the invention. FIG. 9 is a diagram illustrating a signal process using the data memory system of FIG. 8.

In the first embodiment, a data memory system 1 is, for example, a memory card constructed by using a flash memory or the like and is used as an external storage medium of an information processor PC as a host. The information processor PC is a personal computer, a multifunctional peripheral, or the like.

The data memory system (memory system) 1 is constructed by, as shown in FIG. 1, a controller (information processor) 2, and M pieces of semiconductor memories 3. Although the configuration in which M pieces of semiconductor memories 3 are provided is employed, one semiconductor memory is sufficient.

The controller 2 reads out a program, data, or the like stored in the semiconductor memory 3 on the basis of an operation program and performs a predetermined process or gives a data writing instruction.

The semiconductor memory 3 is, for example, a nonvolatile semiconductor memory such as a flash memory. The semiconductor memory 3 is not limited to a flash memory but may be a memory capable of storing data such as SRAM (Static Random Access Memory), DRAM (Dynamic RAM), MRAM (Magnetoresistive RAM), EPROM (Erasable and Programmable Read Only Memory) or the like.

In the embodiment of the invention, the controller and the memory are separated from each other. Alternately, an embedded semiconductor obtained by forming the controller, the memory, and peripheral parts as one component may be used.

The controller 2 and the semiconductor memory 3 are connected to each other via a semiconductor memory bus MB. The controller 2 is constructed by a control circuit 4, an input/output circuit 5, and the like. The control circuit 4 controls the input/output circuit 5, and the input/output circuit 5 controls transmission of data between the semiconductor memory 3 and the information processor PC.

Further, the information processor PC and the controller 2 are connected to each other via an information processor bus PCB. The information processor bus PCB has a mechanical coupling means and may be of a contact type which is electrically connected or a non-contact type of transmitting information by an information transmission medium such as electric waves.

To the control circuit 4 of the controller 2, a signal line S is connected. The signal line S also has a mechanical coupling means and may be of a contact type which is electrically connected or a non-contact type of transmitting information by an information transmission medium such as electric waves.

Via the signal line S, an emergency stop signal is supplied from the outside to the control circuit 4. When the emergency stop signal is received, the controller 2 stops a data transfer process in reading/writing operation.

The action of the data memory system 1 in the embodiment will now be described.

First, a process of requesting emergency stop during transfer of read data in the data memory system 1 will be described by using the flowchart of FIG. 2.

When the information processor PC sends a request for reading and transferring data 0 to N to the controller 2 (step S101), the controller 2 sends the request for reading and transferring data 0 to N (FIG. 1) to the semiconductor memory 3 (step S102) and notifies the information processor PC of transfer of read data (step S103).

By the notification of transfer of read data, data in the semiconductor memory 3 is read and transferred sequentially from data 0 to the information processor PC via the controller 2 (step S104).

For example, when an emergency stop signal for requesting emergency stop is received via the signal line S on completion of transfer of data up to data K to the information processor PC during the process of step S104 (step S105), the control circuit 4 receives the emergency stop signal, immediately stops the transfer process, and notifies the information processor PC of end of the read data transfer (step S106). The end of the read data transfer is notified irrespective of whether the transfer is finished normally or abnormally.

Even if a request for transferring read data is sent again from the information processor PC after notifying the information processor PC of the end of the read data transfer (step S107), the controller 2 does not transfer data but notifies the information processor PC of an untransferable state of read data (step S108).

Next, a process performed when the emergency stop signal is issued during transfer of write data in the data memory system 1 will now be described by using the flowchart of FIG. 3.

When the information processor PC sends a request for transferring write data 0 to N to the controller 2 (step S201), the controller 2 sends the request for transferring write data 0 to N to the semiconductor memory 3 (step S202) and notifies the information processor PC of transfer of write data (step S203).

By the notification of transfer of write data, data is sequentially transferred from the information processor PC to the semiconductor memory 3 (step S204).

For example, when an emergency stop signal for requesting emergency stop is received via the signal line S on completion of transfer of write data up to data K during the process of step S204 (step S205), the control circuit 4 immediately stops the transfer process on reception of the emergency stop signal and notifies the information processor PC of end of the write data transfer (step S206). The end of write data is notified irrespective of whether the transfer is finished normally or abnormally.

Even if a request for transferring write data 0 to N is sent again from the information processor PC after notifying the information processor PC of the end of transfer of write data (step S207), the controller 2 notifies the information processor PC of an untransferable state of write data without transferring data (step S208).

Another example of process performed when the emergency stop signal is issued during transfer of write data in the data memory system 1 will now be described by using the flowchart of FIG. 4.

When the information processor PC sends a request for transferring write data 0 to N to the controller 2 (step S301), the controller 2 sends the request for transferring the write data 0 to N to the semiconductor memory 3 (step S302) and notifies the information processor PC of transfer of the write data (step S303).

By the notification of transfer of write data, write data is sequentially transferred from the information processor PC to the semiconductor memory 3 (step S304).

For example, when the emergency stop signal for requesting emergency stop on completion of transfer of write data up to the data K is input via the signal line S during the process of step S304 (step S305), the control circuit 4 immediately stops the transfer process on reception of the emergency stop signal and notifies the information processor PC of a busy state (step S306) so that the next command is not transmitted from the information processor PC.

FIG. 4 shows the process performed at the time of transfer of write data. At the time of transfer of read data, similar process is performed.

FIG. 5 is a diagram showing an example of a sequence of power source voltage supplied to the data memory system 1 after the emergency stop request is made by the emergency stop signal.

FIG. 5 shows, from top to bottom, sequence of each of the emergency stop signal, external power source voltage VCC, and a control status input to the data memory system 1.

If a data transfer request is sent from the information processor PC when the data memory system 1 is in an idle state, based on the request, the data memory system 1 performs the data transfer process. When the emergency stop signal of an active state (low level) is input during the data transfer process, the data memory system 1 executes an interrupting process and enters a process unacceptable state in which any process is not accepted.

The process unacceptable state is canceled when the power source voltage VCC of the data memory system 1 is set to the low level (the power source voltage VCC is set to an OFF state) and the external power source voltage is set again to an ON state, thereby performing the process of resetting the data memory system 1.

FIG. 6 is a block diagram showing an example of connection in the case where the information processor PC transmits a power-on-reset signal to the data memory system 1.

In this case, a reset signal RS output from the information processor PC is supplied to the data memory system 1.

FIG. 7 is a sequence chart showing the difference between the operation of the power-on-reset signal and that of the emergency stop signal in the data memory system 1 of FIG. 6.

FIG. 7 shows, from top to bottom, sequences of the emergency stop signal, external power source voltage VCC, and a control status input to the data memory system 1.

The process performed by the emergency stop signal is similar to that of FIG. 5. In the case where the power-on-reset signal which is active (low level) is supplied from the information processor PC, the data memory system 1 performs the resetting process and, after that, enters an idle state to start again accepting the data transfer process or the like.

That is, the data memory system 1 enters the idle state after the resetting process and accepts the data transfer process of the information processor PC. After the emergency stop process performed by the emergency stop signal, however, the data memory system 1 does not accept the data transfer process.

Consequently, by performing the emergency stop process by the emergency stop signal in the case where the external power source voltage level becomes unstable during the data transfer process or the like, data in the data memory system 1 can be protected.

The emergency stop signal input to the data memory system 1 may be output from the information processor PC as shown in FIG. 8. In this case, the emergency stop signal output from the information processor PC is supplied to the data memory system 1 via the signal line S1.

As described above, the configuration in which the emergency stop signal is output from the information processor PC is effective, for example, when the information processor PC has multiple tasks (tasks A and B) as shown in FIG. 9.

If necessity of protecting data in the data memory system 1 arises when the task A occupies the data memory system 1, the task B can output the emergency stop signal to the data memory system 1 via an I/O (Input/Output) port which is different from the information processor bus PCB.

Figure 10:
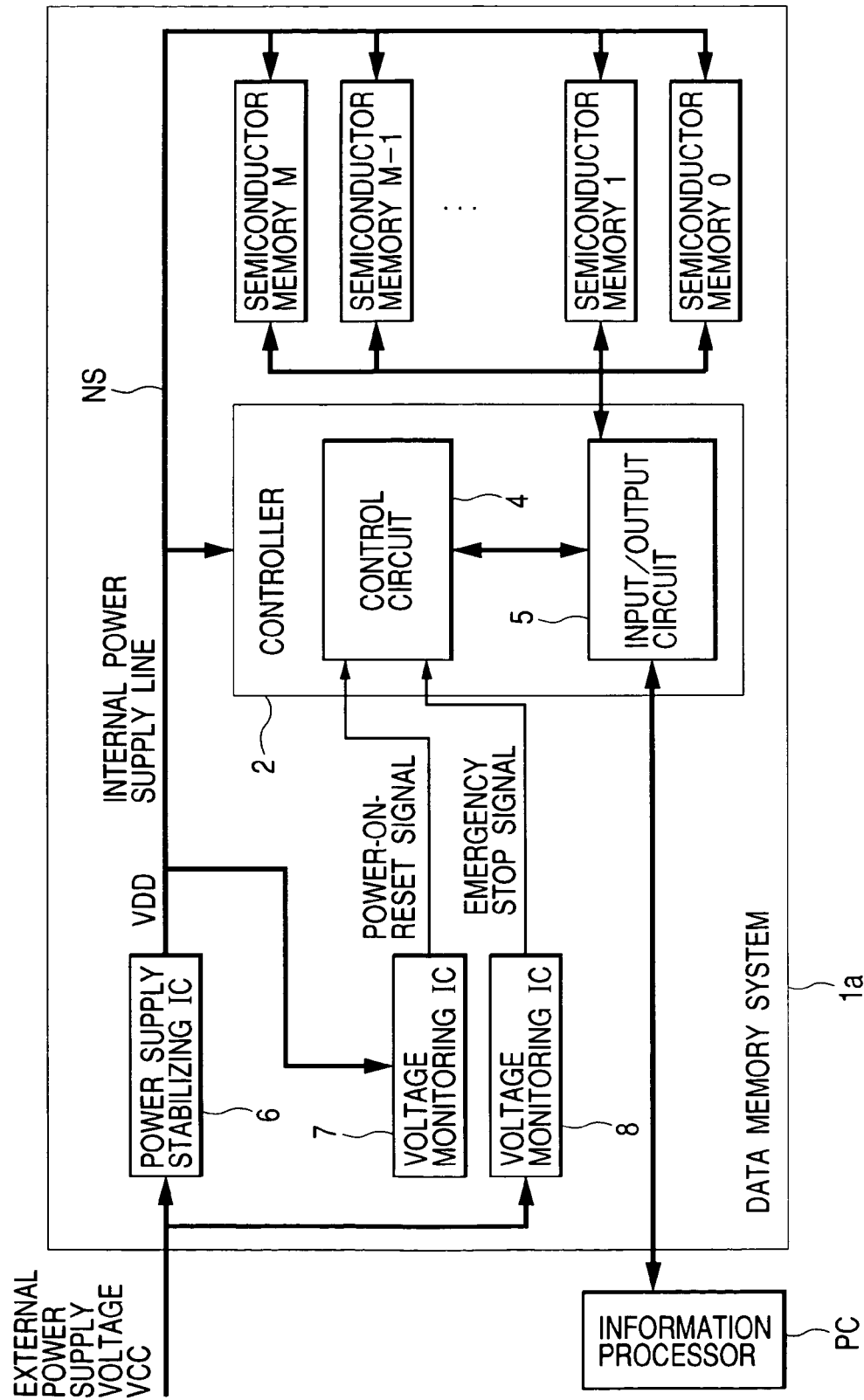
FIG. 10 is a block diagram showing an example of a data memory system according to another embodiment of the invention.

FIG. 10 is a block diagram showing another example of a data memory system 1a.

In this case, the data memory system 1a has a configuration obtained by adding a power supply stabilizing IC (power source voltage unit) 6 and voltage monitoring ICs 7 and 8 to the data memory system 1 of FIG. 1.

The power supply stabilizing IC 6 generates an internal power supply voltage VDD from the external power supply voltage VCC supplied from the outside and supplies the internal power supply voltage VDD to each of the controller 2, semiconductor memory 3, and voltage monitoring IC (first voltage monitoring unit) 7 via an internal power supply line NS.

The voltage monitoring IC 7 monitors the voltage level of the internal power supply voltage VDD generated by the power supply stabilizing IC 6 and, if an abnormal state occurs, outputs the power-on-reset signal to the control circuit 4. To the voltage monitoring IC (second voltage monitoring unit) 8, the external power supply voltage VCC is supplied. In the case where an abnormal state occurs in the external power supply voltage VCC, the emergency stop signal is output to the control circuit 4.

The operation in the data memory system 1a will be described by using the sequence chart of FIG. 11.

Figure 11:
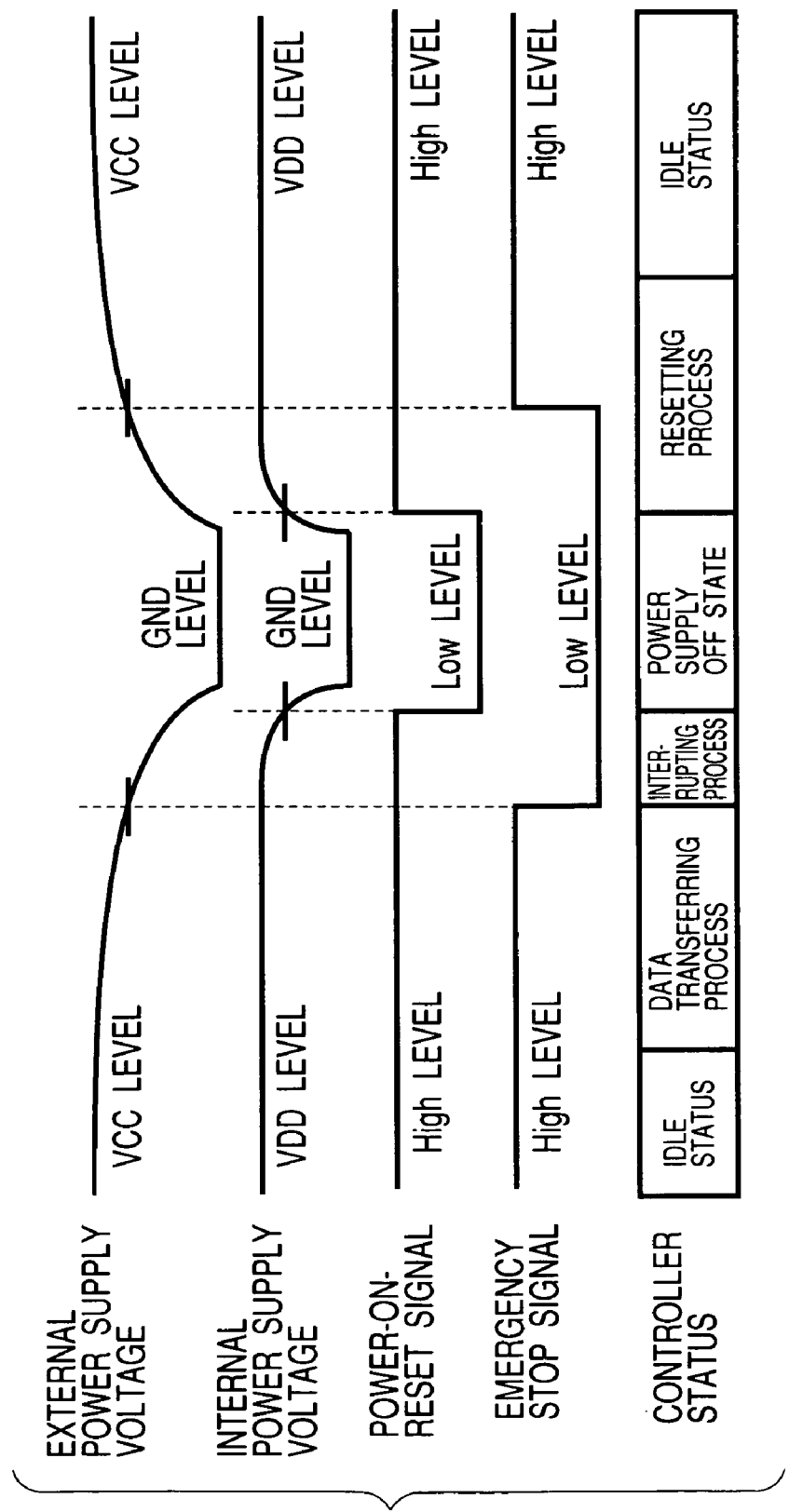
FIG. 11 is a sequence chart of a power source voltage by the data memory system of FIG. 10.

FIG. 11 shows, from top to bottom, sequences of the external power supply voltage VCC, internal power supply voltage VDD, the power-on-reset signal output from the voltage monitoring IC 7, the emergency stop signal output from the voltage monitoring IC 8, and a control status supplied to the data memory system 1a.

In the diagram, the external power supply voltage VCC drops from a normal voltage level (VCC level) to the GND (reference potential) level and, again recovers to the VCC level.

First, when the external power supply voltage VCC drops to a certain voltage level during the data transfer process of the data memory system 1a, the voltage monitoring IC 8 detects the drop in the external power source voltage VCC and outputs the emergency stop signal to the control circuit 4.

On receipt of the emergency stop signal, the data memory system 1a executes an interrupting process and enters a process unacceptable state in which any process is not accepted.

After that, when the voltage level of the external power supply voltage VCC drops, the internal power supply voltage VDD also decreases. The voltage monitoring IC 7 detects the voltage drop and outputs the power-on-reset signal to the control circuit 4. Subsequently, the external power supply voltage VCC becomes the GND level.

When the voltage level of the external power supply voltage VCC increases again, accordingly, the voltage level of the internal power source voltage VDD also increases. When the internal power supply voltage VDD becomes a certain voltage level or higher, the voltage monitoring IC 7 resets the power-on-reset signal (to the high level) and the process of resetting the data memory system 1a is performed.

When the external power supply voltage VCC becomes a certain voltage level or higher during the resetting process, the voltage monitoring IC 8 sets the emergency stop signal to an inactive state (high level).

Since the emergency stop signal is ignored during the resetting process, when the resetting process is finished after the power is turned on, the data memory system 1a enters an idle state.

Figure 12:
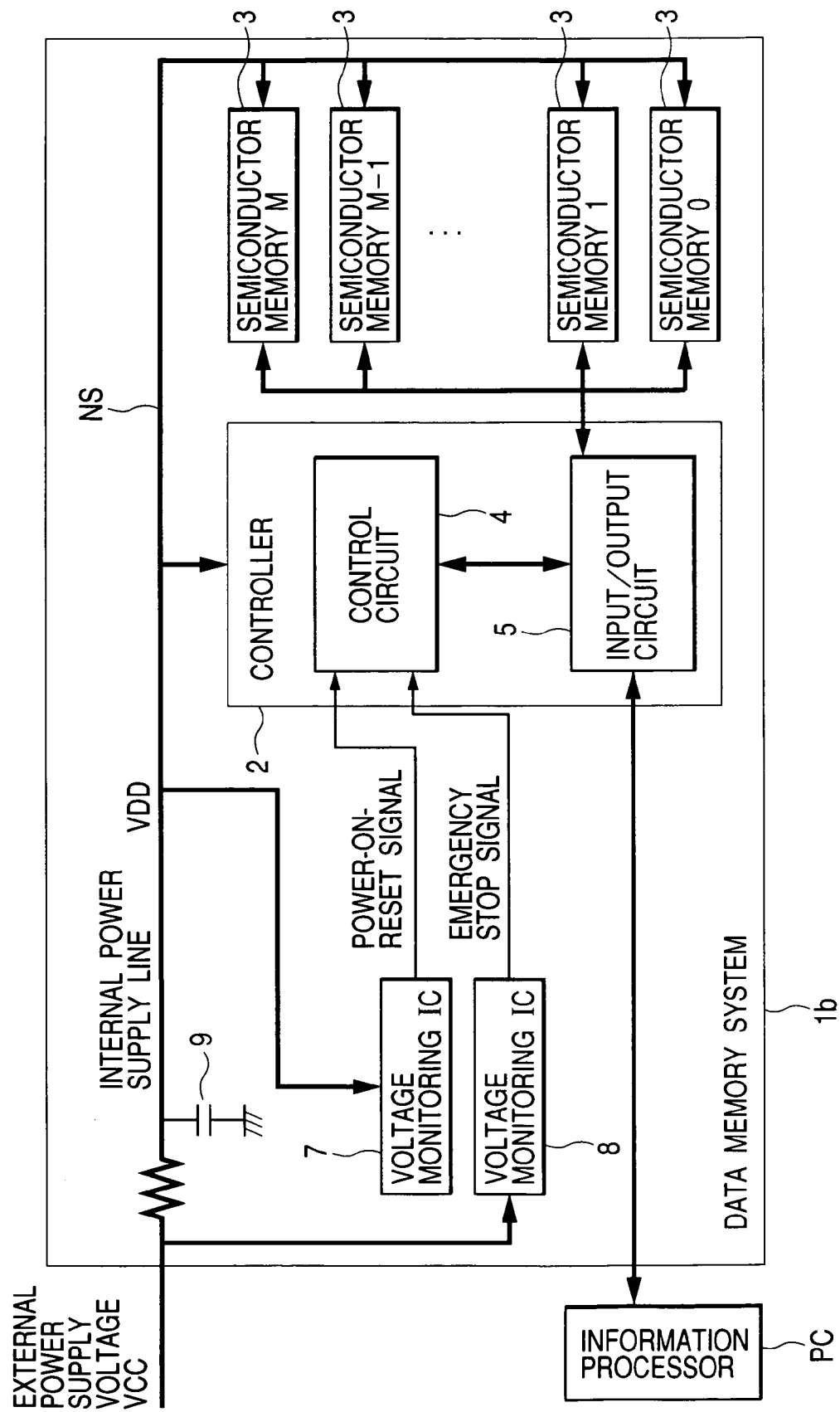
FIG. 12 is a block diagram showing another example of the data memory system according to another embodiment of the invention.

FIG. 12 is a block diagram showing a data memory system 1b which is similar to the data memory system 1a except that a capacitor (power supplying unit) 9 of a large capacity is provided in place of the power supply stabilizing IC 6 (FIG. 10).

In this case, the capacitor 9 is connected between the ground and the internal power supply line NS. Via the internal power supply line NS, the internal power supply voltage VDD (which is equal to the external power source voltage VCC) is supplied to the controller 2, semiconductor memory 3, and voltage monitoring IC 7. To the voltage monitoring IC 8, the external powers supply voltage VCC is directly supplied without using the internal power source line NS. In place of the capacitor 9, a battery or the like may be connected to the internal power source line NS.

Figure 13:
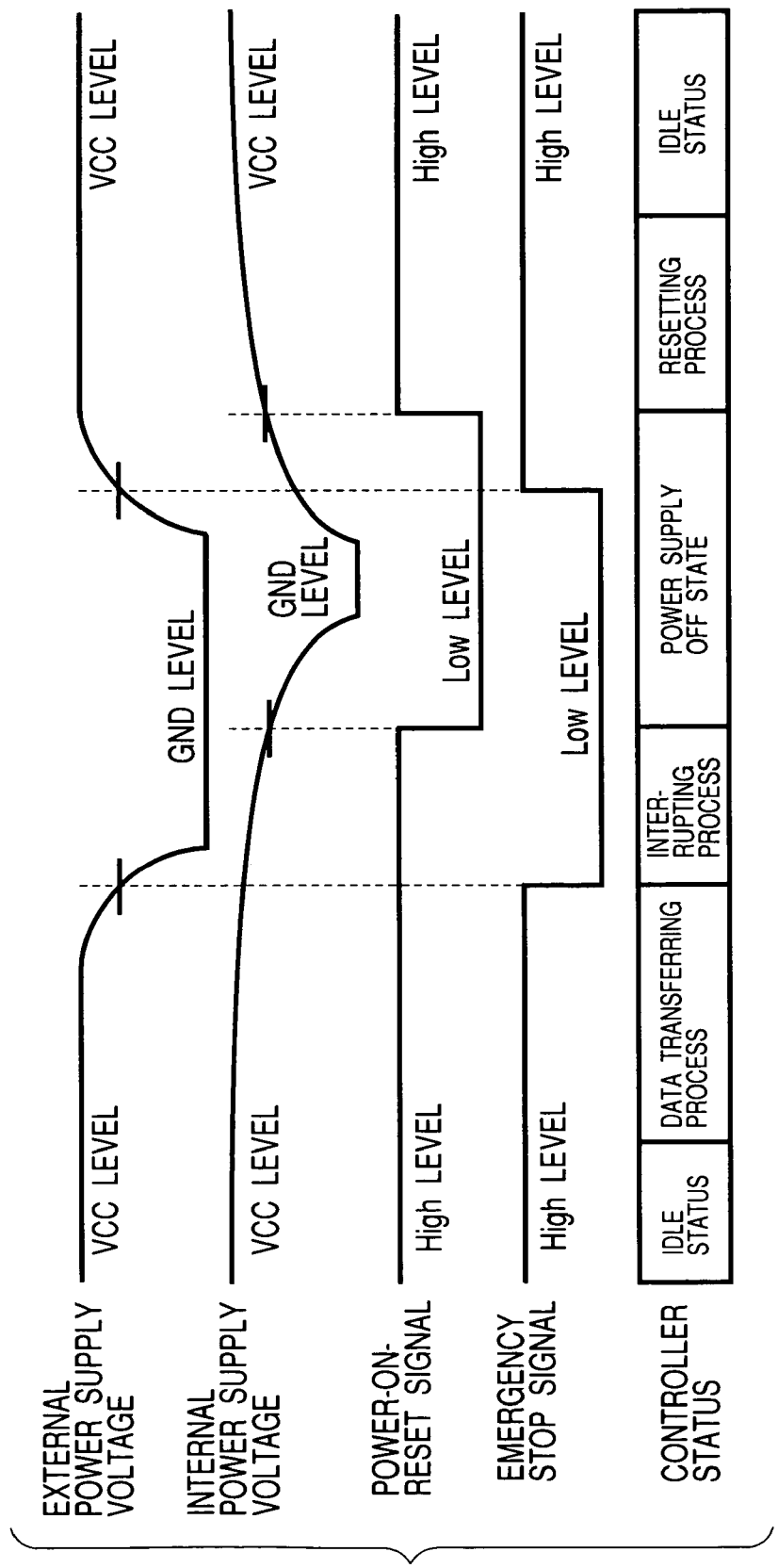
FIG. 13 is a sequence chart showing an example of operation of the data memory system of FIG. 12.

FIG. 13 is a sequence chart showing an example of operation in the data memory system 1b.

FIG. 13 shows, from top to bottom, sequences of the external power supply voltage VCC, internal power supply voltage VDD supplied via the internal power supply line NS, the power-on-reset signal output from the voltage monitoring IC 7, the emergency stop signal to be output from the voltage monitoring IC 8, and a control status supplied to the data memory system 1b.

When the external power supply voltage VCC drops to a certain voltage level during the data transfer process of the data memory system 1b, the voltage monitoring IC 8 outputs the emergency stop signal to the control circuit 4. On receipt of the emergency stop signal, the data memory system 1b executes an interrupting process and enters the process unacceptable state.

Since the capacitor 9 is connected to the internal power supply line NS, the internal power supply voltage VDD supplied via the internal power supply line NS drops slowly more than the external power supply voltage VCC.

The voltage monitoring IC 7 detects the voltage drop in the internal power supply voltage VDD and outputs the power-on-reset signal to the control circuit 4. When the external power supply voltage VCC increases from the GND level and becomes equal to or higher than a certain voltage level, the voltage monitoring IC 8 sets the emergency stop signal to an inactive state (high level).

After that, when the internal power source voltage VDD becomes a certain level or higher, the voltage monitoring IC 7 resets the power-on-reset signal (to the high level), the process of resetting the data memory system 1b is performed, and the data memory system 1b enters an idle state.

Figure 14:
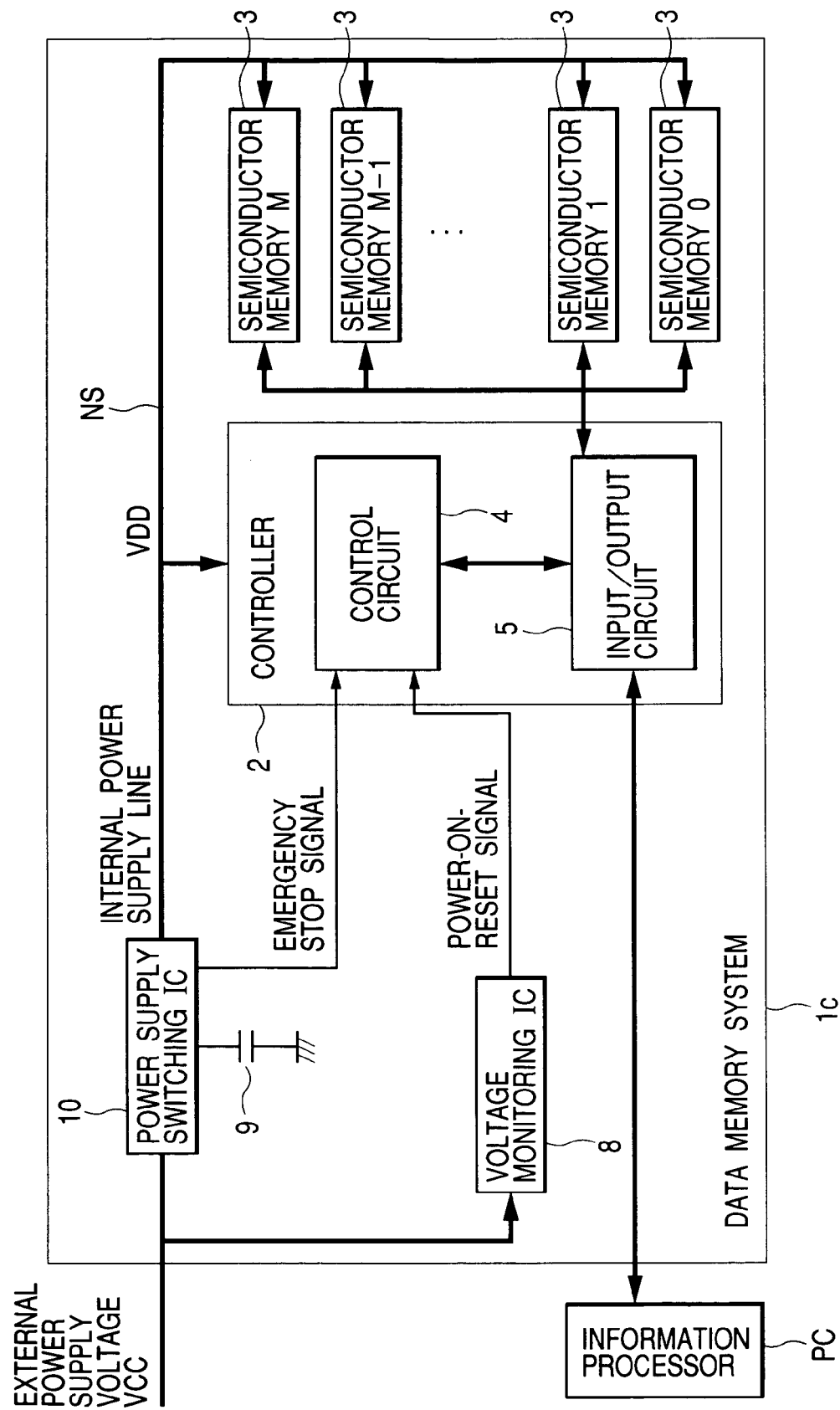
FIG. 14 is a block diagram showing an example of the data memory system according to another embodiment of the invention.

FIG. 14 is a block diagram of a data memory system 1c having another configuration.

The data memory system 1c is different from the data memory system 1b (FIG. 12) with respect to the point that a power supply switching IC (power supply switching unit) 10 for outputting an emergency stop signal is newly provided in place of the voltage monitoring IC 8.

The power supply switching IC 10 monitors the voltage level of the external power supply voltage VCC. When the voltage level becomes equal to or lower than a certain voltage level, the power supply switching IC switches the supply source of the internal power supply voltage VDD via the internal power supply line NS to the capacitor 9 and outputs the emergency stop signal to the control circuit 4. In this case as well, the capacitor 9 is not limited to a capacitor of large capacity but may be a battery or the like.

Figure 15:
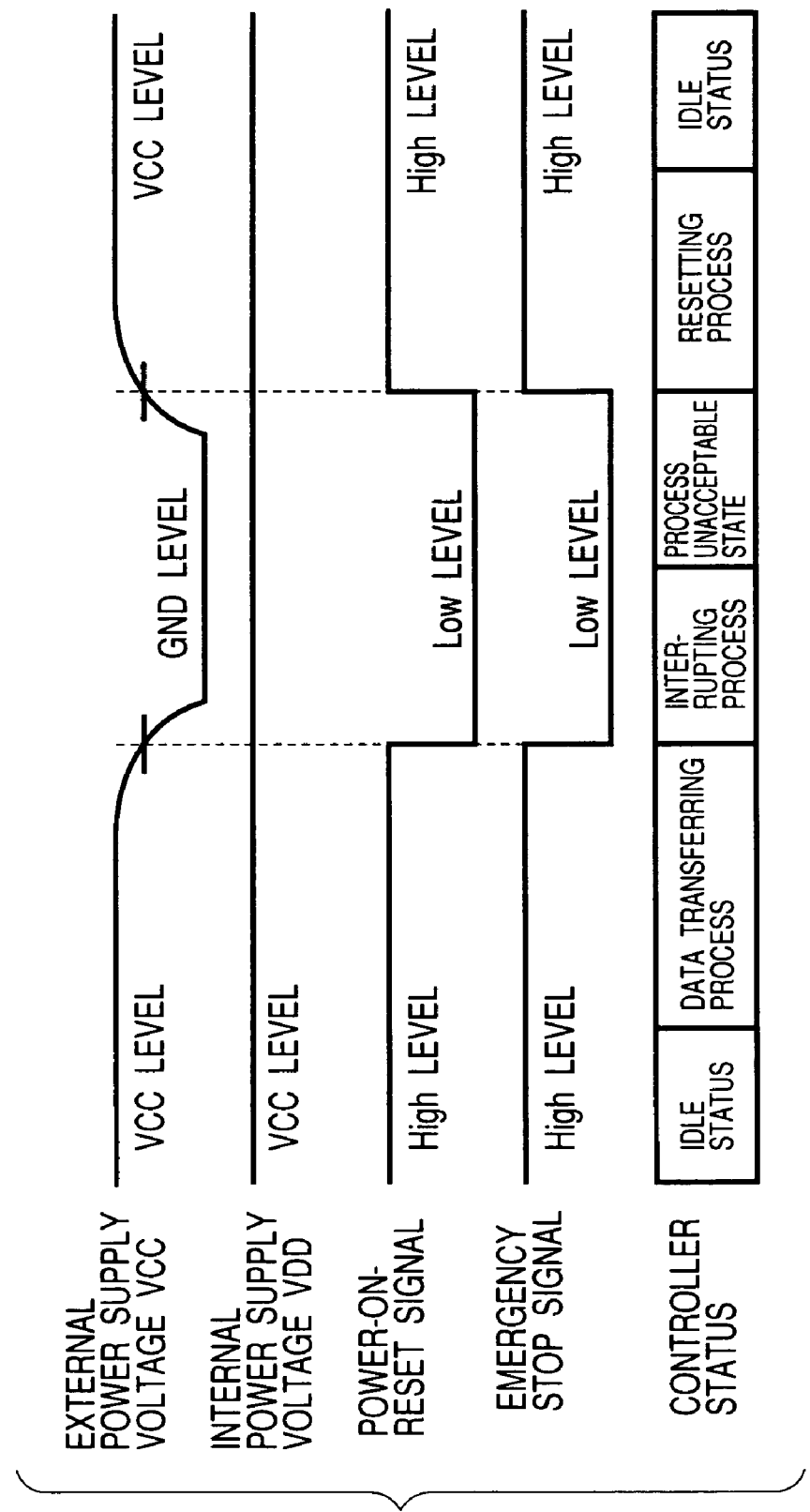
FIG. 15 is a sequence chart showing an example of the operation of the data memory system of FIG. 14.

FIG. 15 is a sequence chart showing an example of operation of the data memory system 1c.

FIG. 15 shows, from top to bottom, sequences of the external power supply voltage VCC, internal power supply voltage VDD supplied via the internal power supply line NS, the power-on-reset signal output from the voltage monitoring IC 7, the emergency stop signal output from the power supply switching IC 10, and a control status supplied to the data memory system 1c.

When the external power supply voltage VCC drops during the data transfer process of the data memory system 1c, the power supply switching IC 10 switches the power supply source from the external power source voltage VCC to the capacitor 9. Consequently, the data memory system 1c can reduce influence of the external power supply voltage VCC.

The power supply switching IC 10 outputs the emergency stop signal to the control circuit 4, and the voltage monitoring IC 7 outputs the power-on-reset signal to the control circuit 4. The controller 2 executes the interrupting process on receipt of the emergency stop signal and enters the process unacceptable state.

After that, when the voltage level of the external power source voltage VCC becomes a certain level or higher, the voltage supply switching IC 10 resets the power-on-reset signal (to the high level) and the voltage monitoring IC 7 sets the emergency stop signal to an inactive state (high level).

By the above, the process of resetting the data memory system 1a is performed and the data memory system 1c enters an idle state.

Figure 16:
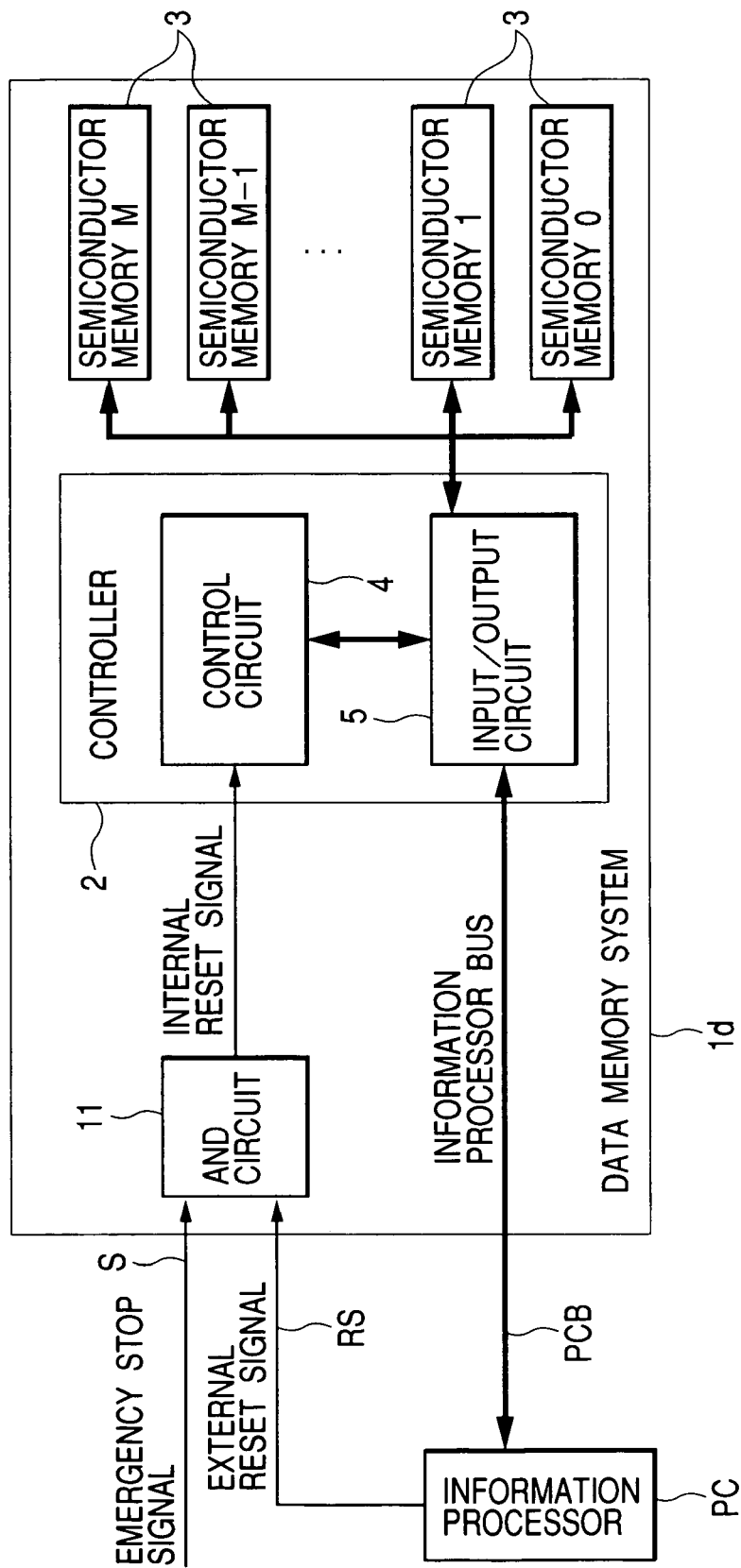
FIG. 16 is a block diagram showing another example of the data memory system according to another embodiment of the invention.

FIG. 16 is a block diagram of a data memory system 1d as an example of the case of using the same signal as the emergency stop signal and an external reset signal.

The data memory system 1d has a configuration obtained by newly adding an AND circuit 11 to the configuration of the data memory system 1 (FIG. 1).

The emergency stop signal is input to one of input terminals of the AND circuit 11 and the external reset signal which is output from the information processor PC is input to the other input terminal. An output signal of the AND circuit 11 becomes an internal reset signal and is connected so as to be supplied to the control circuit 4 of the controller 2.

The operation in the data memory system 1d will be described with reference to the sequence chart of FIG. 17.

Figure 17:
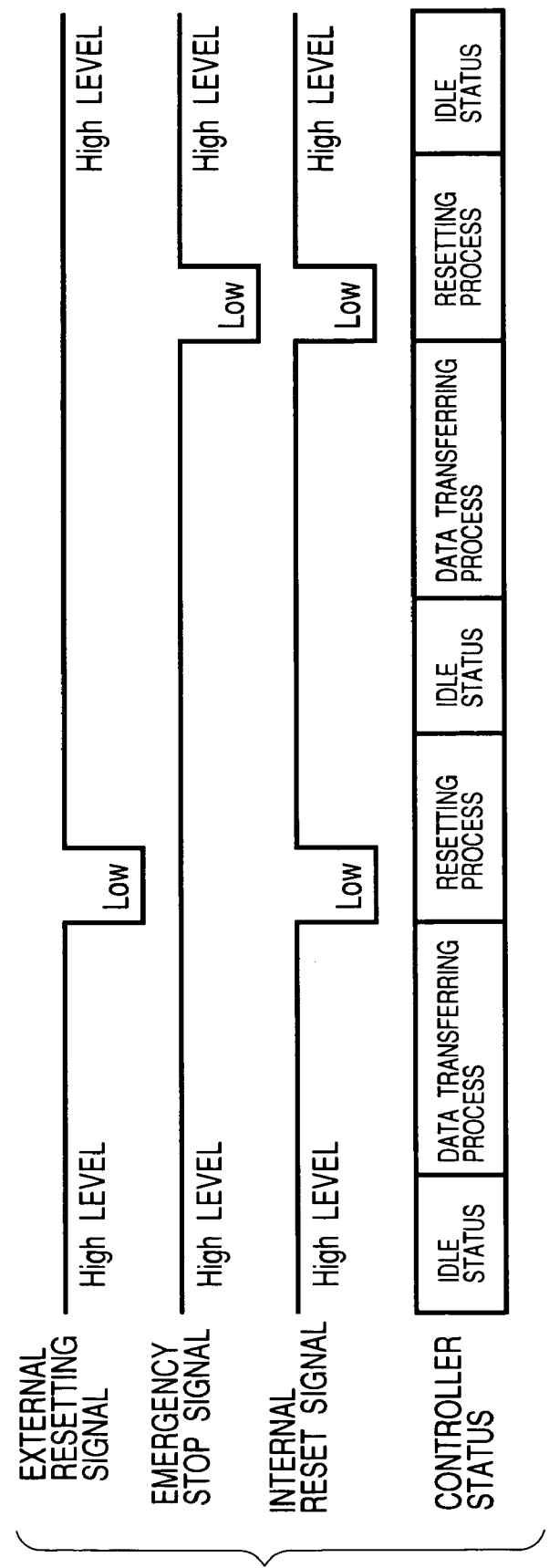
FIG. 17 is a sequence chart showing an example of the operation of the data memory system of FIG. 16.

FIG. 17 shows, from top to bottom, sequences of the external reset signal which is output from the information processor PC, the emergency stop signal, the external reset signal which is output from the AND circuit 11, and a control status.

When the external reset signal (low level) is output during the data transfer process of the data memory system 1d, an output of the AND circuit 11 becomes the low level. The internal reset signal becomes active and the process of resetting the data memory system 1d is performed.

After the resetting process, if the emergency stop signal (low level) is output again during the data transfer process, an output of the AND circuit 11 becomes the low level, so that the internal reset signal becomes active and the process of resetting the data memory system 1d is performed.

As described above, by using the emergency stop signal also as the external reset signal, an I/O pin or the like for inputting the emergency stop signal to the controller 2 becomes unnecessary. The cost can be suppressed and the function can be simplified, so that designing of the controller 2 can be facilitated.

Figure 18:
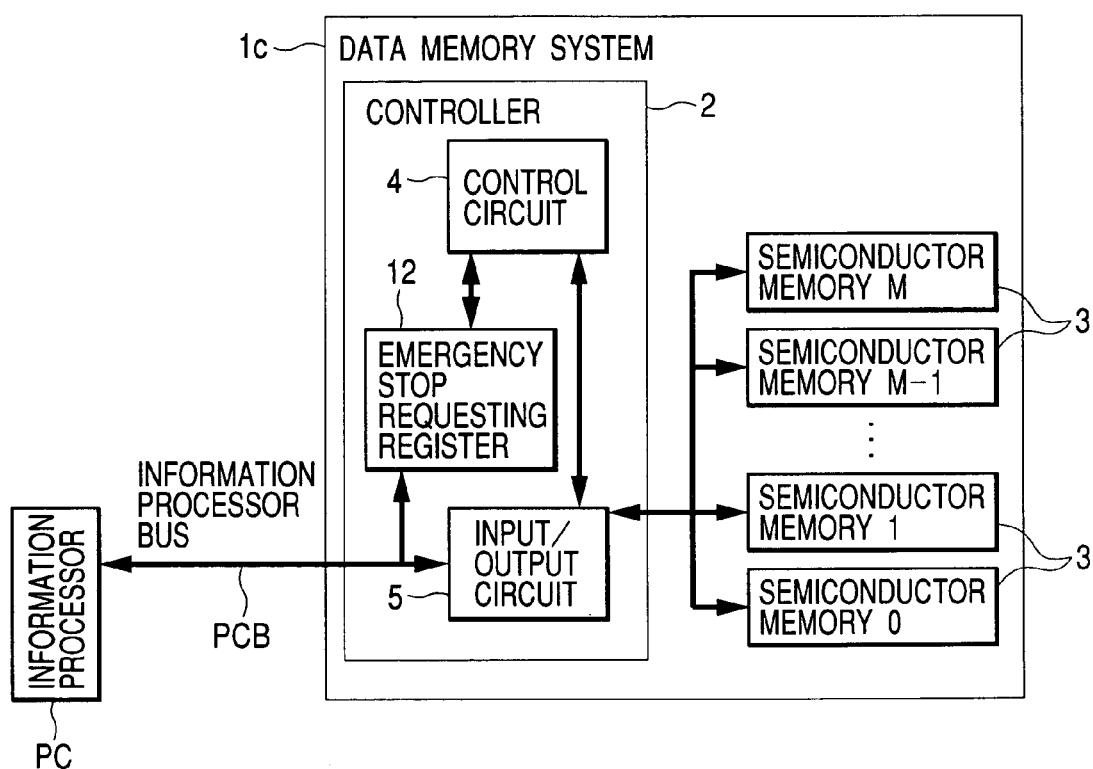
FIG. 18 is a block diagram showing an example of the data memory system according to another embodiment of the invention.

FIG. 18 is a block diagram of a data memory system 1e as an example of the case of sending the emergency stop request via the information processor bus PCB.

Figure 19:
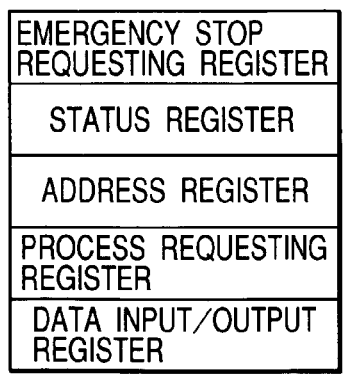
FIG. 19 is a diagram illustrating an example of registers accessed by an information processor provided for the data memory system of FIG. 18.

In the data memory system 1e, the controller 2 is provided with an emergency stop request register (register) 12. The emergency stop request register 12 can be directly accessed by the information processor PC. Consequently, by setting data in the emergency stop request register 12, the emergency stop request can be made. FIG. 19 is a diagram illustrating an example of registers which are provided for the controller 2 and can be accessed by the information processor PC.

By using the emergency stop request register 12, without performing a resetting process or the like at the time of resetting the data memory system 1e from the process unacceptable state to the idle state, the data memory system 1e can be freely reset.

Figure 20:
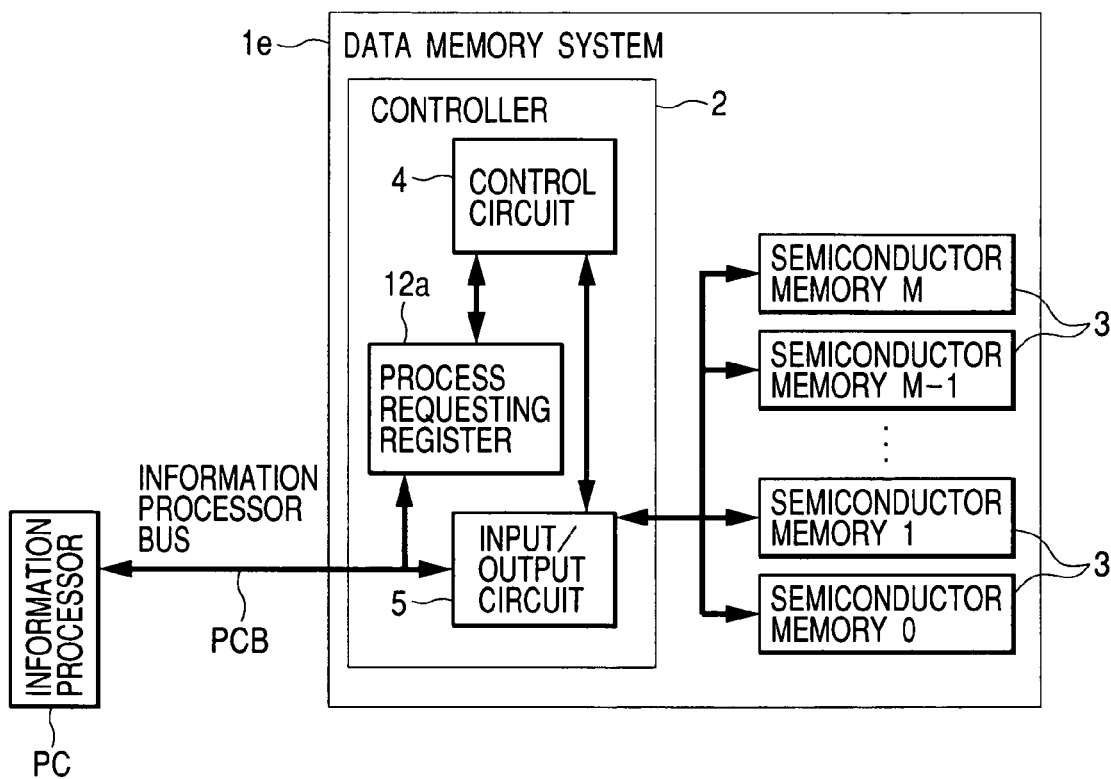
FIG. 20 is a block diagram showing another example of the data memory system according to another embodiment of the invention.
Figure 21:
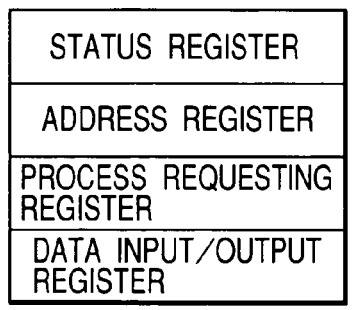
FIG. 21 is a diagram illustrating an example of registers accessed by the information processor provided for the data memory system of FIG. 20.

Alternately, as shown in FIG. 20, the emergency stop request can be set by using a part of a process requesting register (register) 12a for requesting reading/writing of data without newly providing the controller 2 with the emergency stop request register 12. The process request register 12a is, as shown in FIG. 21, one of existing registers which can be accessed by the information processor PC.

According to the first embodiment, transfer of erroneous data, rewriting of data to erroneous data, and the like can be prevented even during the data transfer process, so that reliability of the data memory system can be improved.

In the first embodiment, the case where the read/write data transfer process is being performed has been described. In any of the other cases such as a case where a request for process which does not accompany data transfer is made, in an idle state, during a resetting process, and in a sleep state, the emergency stop request can be accepted.

Second Embodiment

Figure 22:
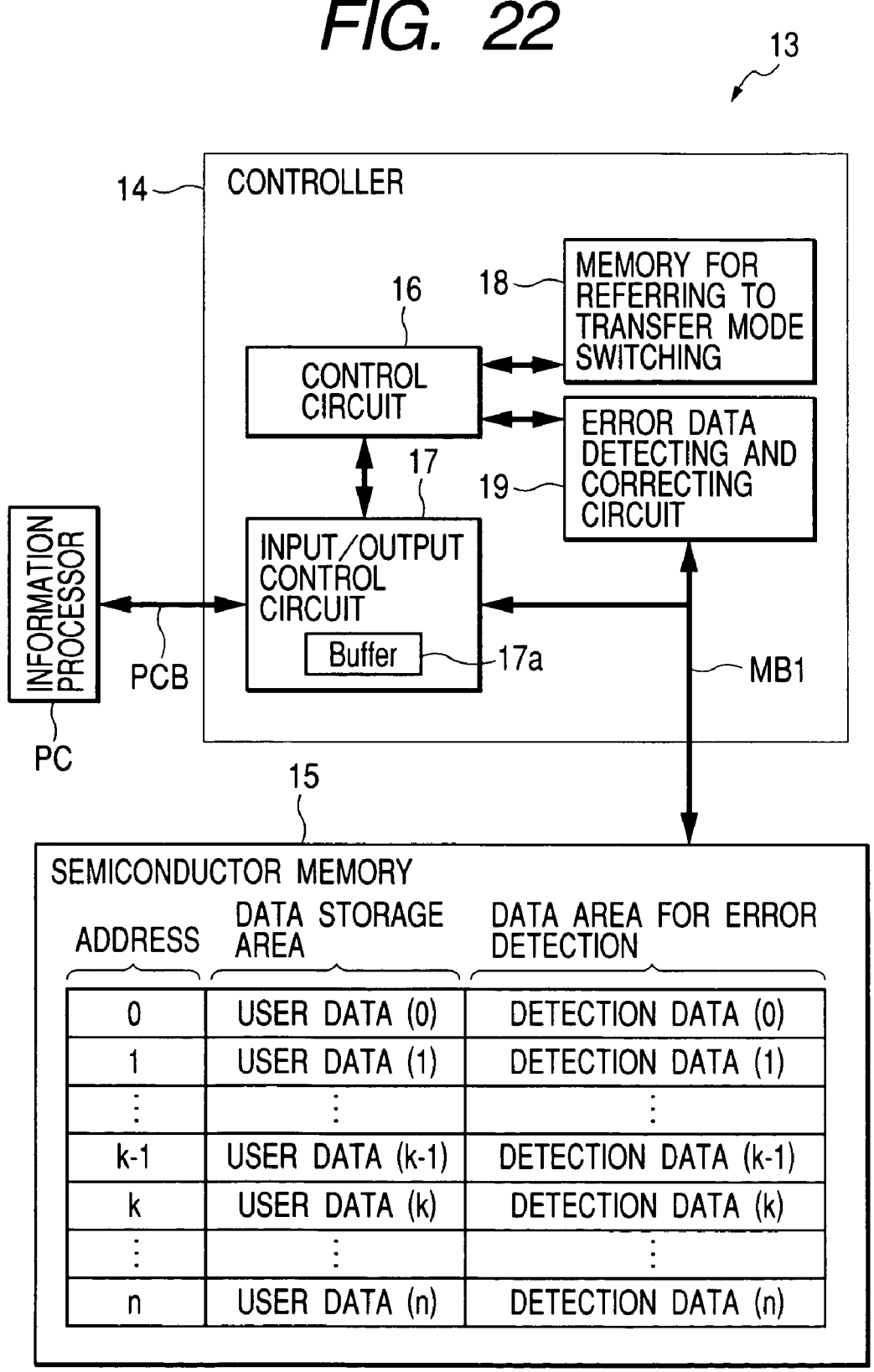
FIG. 22 is a block diagram of a data memory system according to a second embodiment of the invention.
Figure 23:
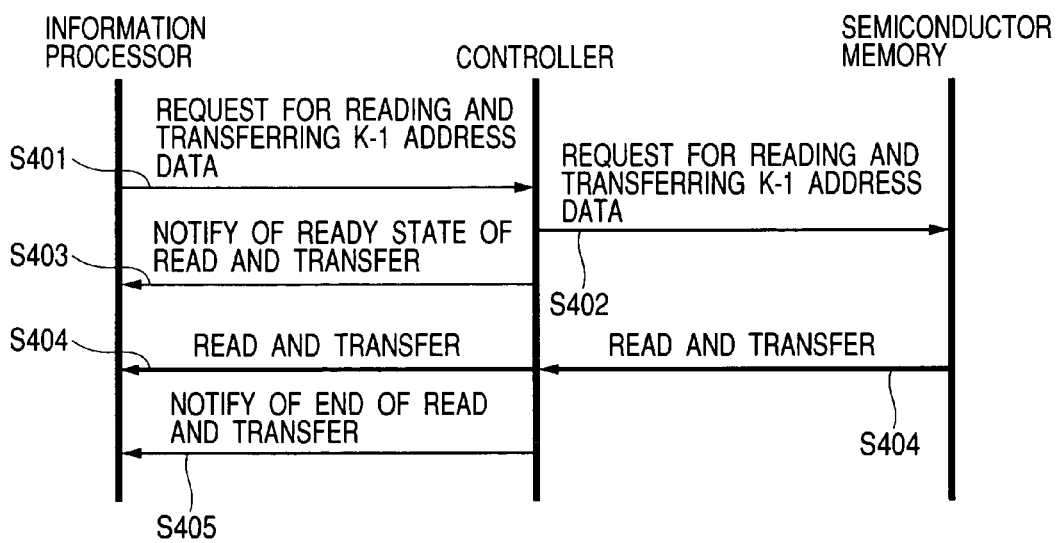
FIG. 23 is a flowchart of transfer of read data when an erroneous data transfer function is set to be valid in the data memory system of FIG. 22.
Figure 24:
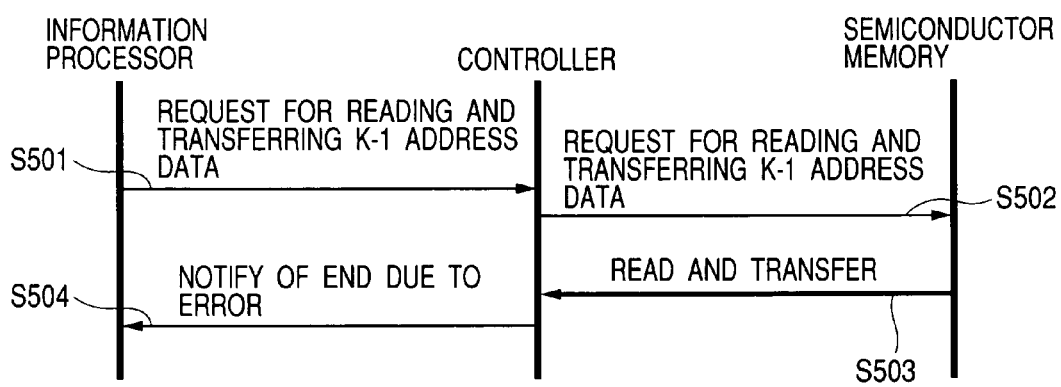
FIG. 24 is a flowchart of transfer of read data when the erroneous data transfer function is set to be invalid in the data memory system of FIG. 22.
Figure 25:
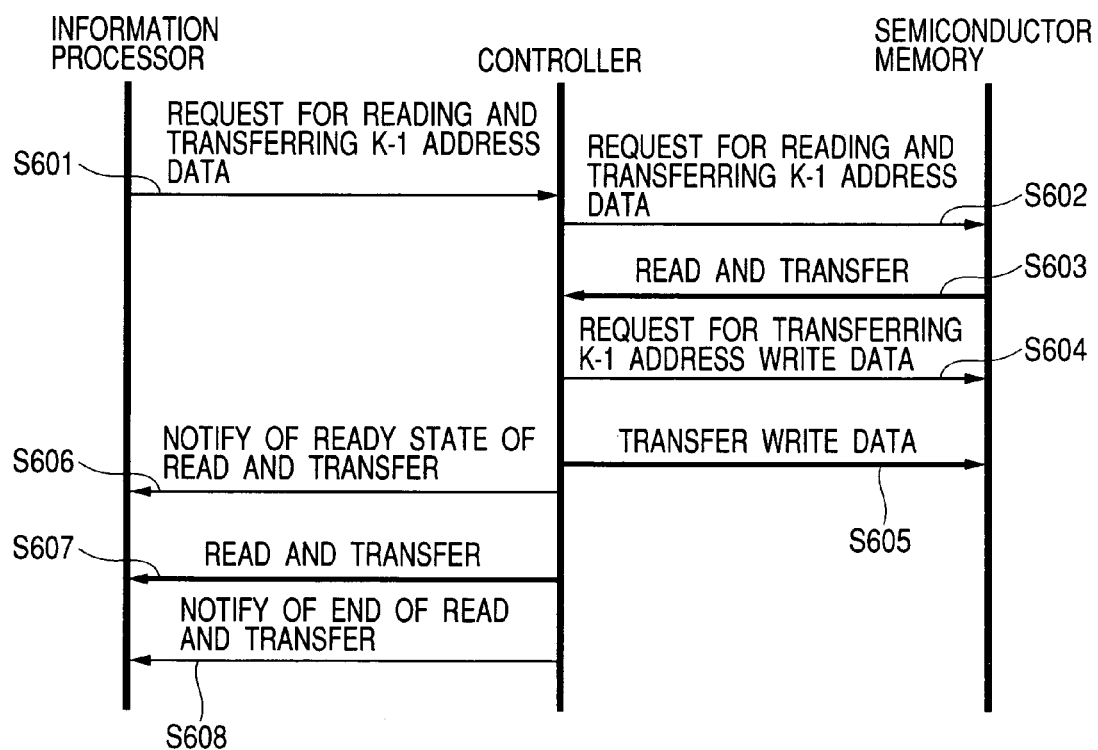
FIG. 25 is a flowchart of transfer of read data when an erroneous data correcting and transferring function of transferring corrected data is set to be valid in the data memory system of FIG. 22.
Figure 26:
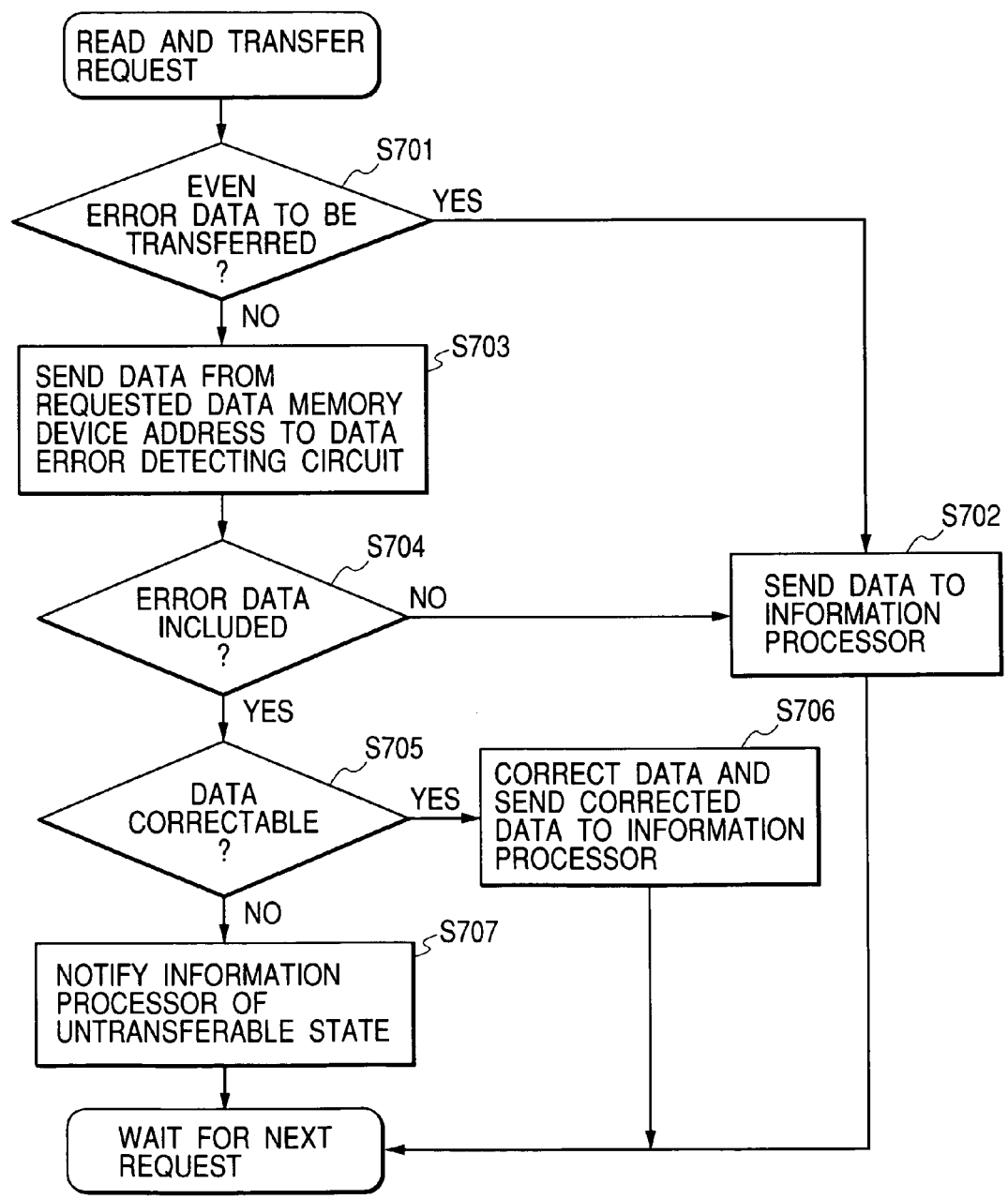
FIG. 26 is a flowchart of operation performed when a read and transfer request is made from a controller provided for the data memory system of FIG. 22.
Figure 27:
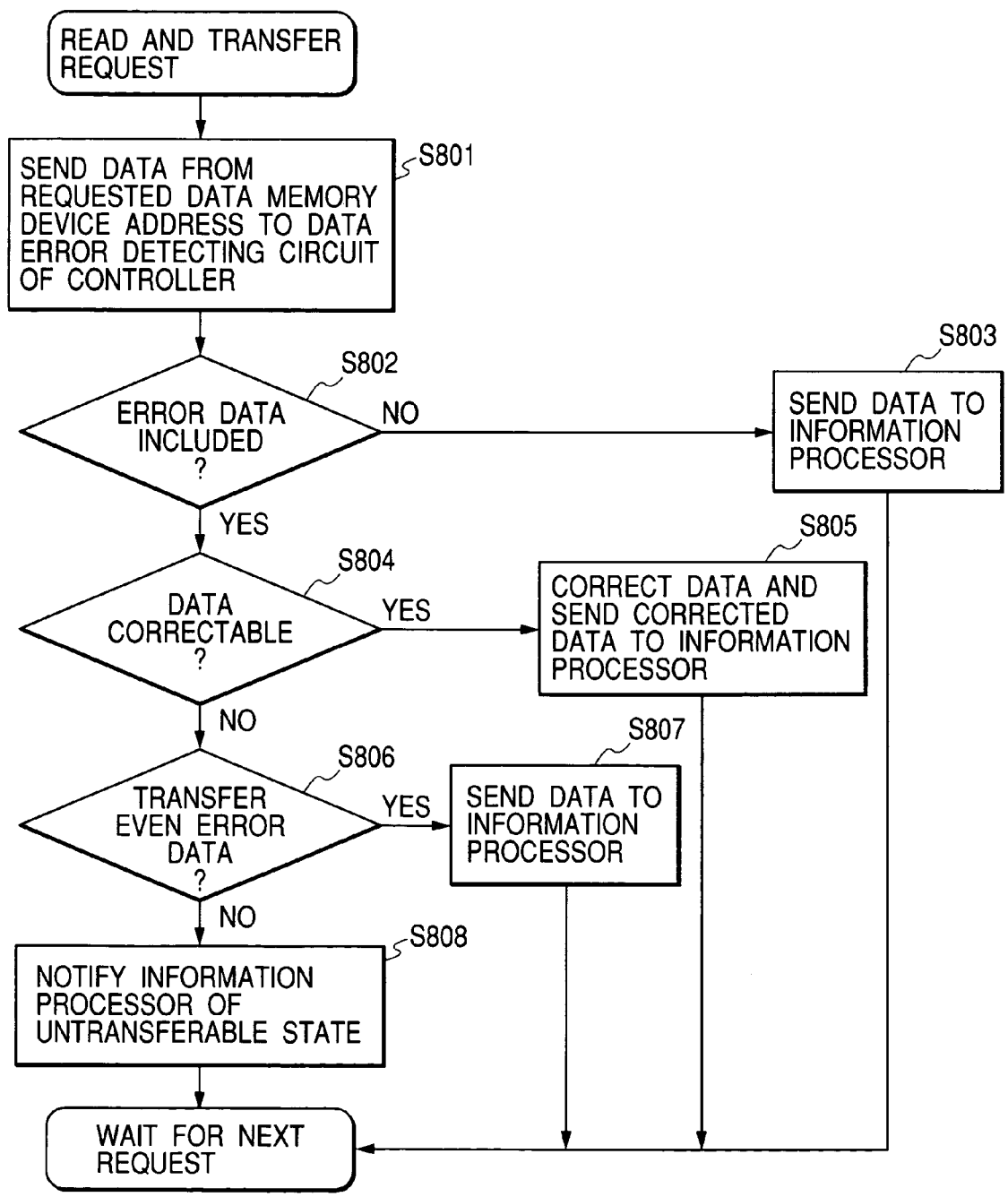
FIG. 27 is a flowchart showing another example of operation performed when a read and transfer request is made from the controller of FIG. 22.
Figure 28:
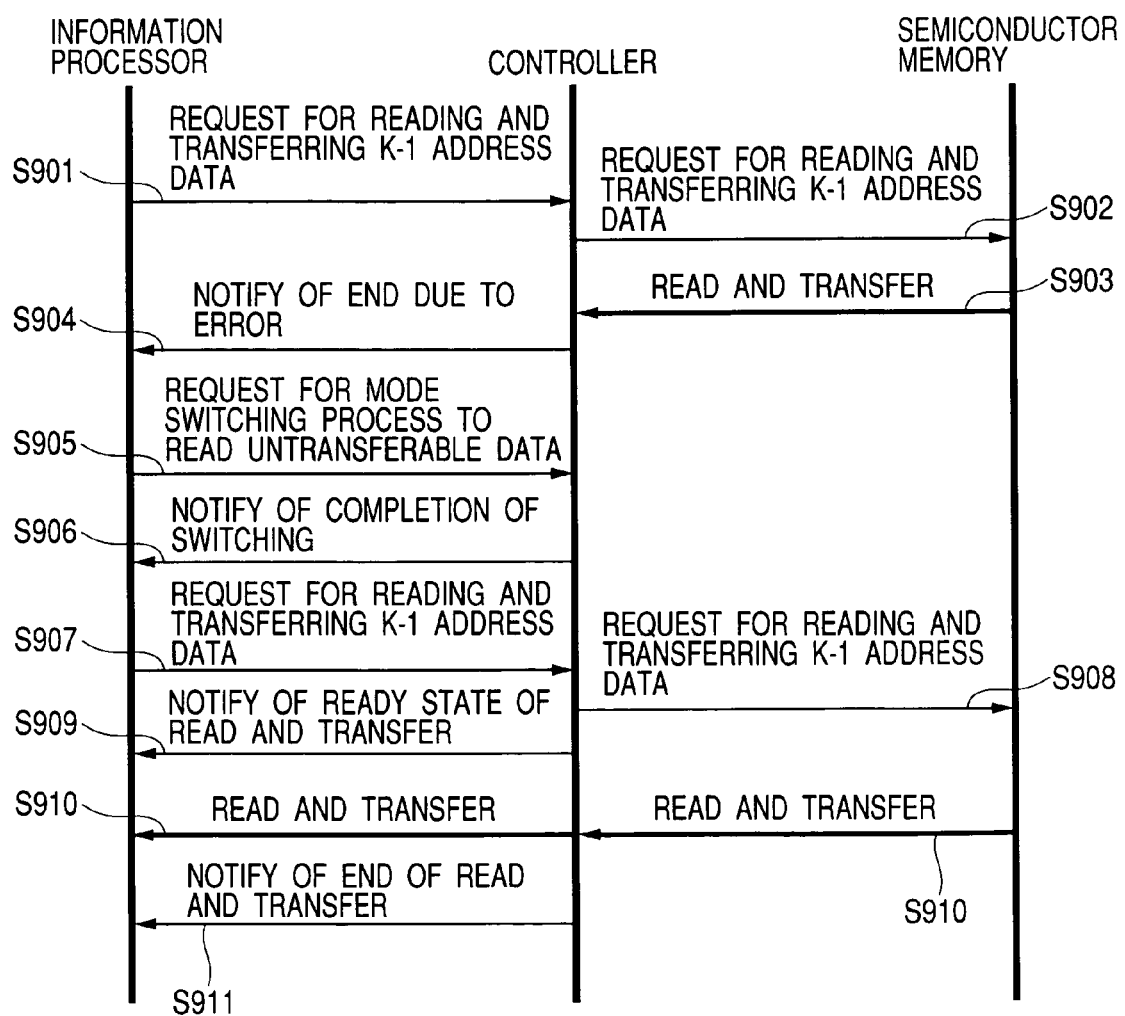
FIG. 28 is a flowchart showing an example of changing transfer function setting data by the data memory system according to the second embodiment of the invention.
Figure 29:
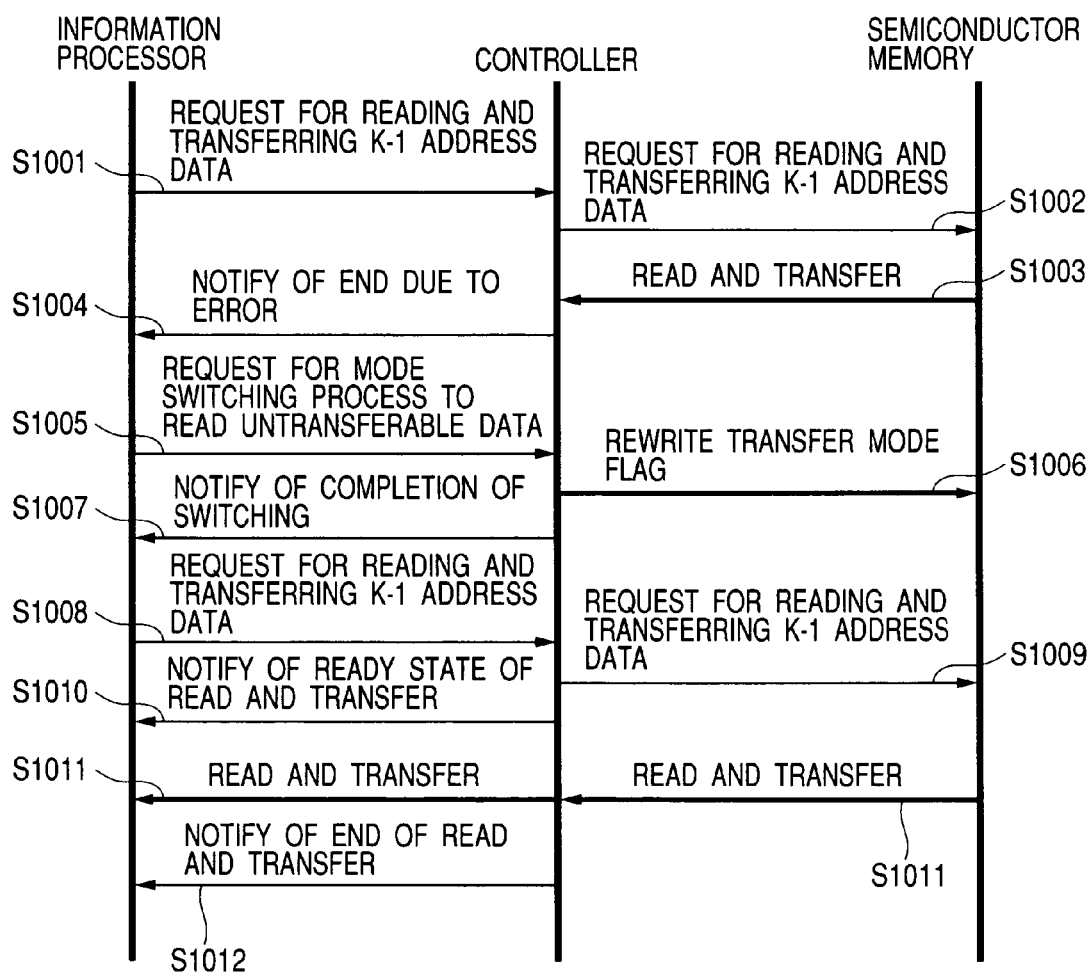
FIG. 29 is a flowchart showing another example of changing the transfer function setting data by the data memory system according to the second embodiment of the invention.
Figure 32:
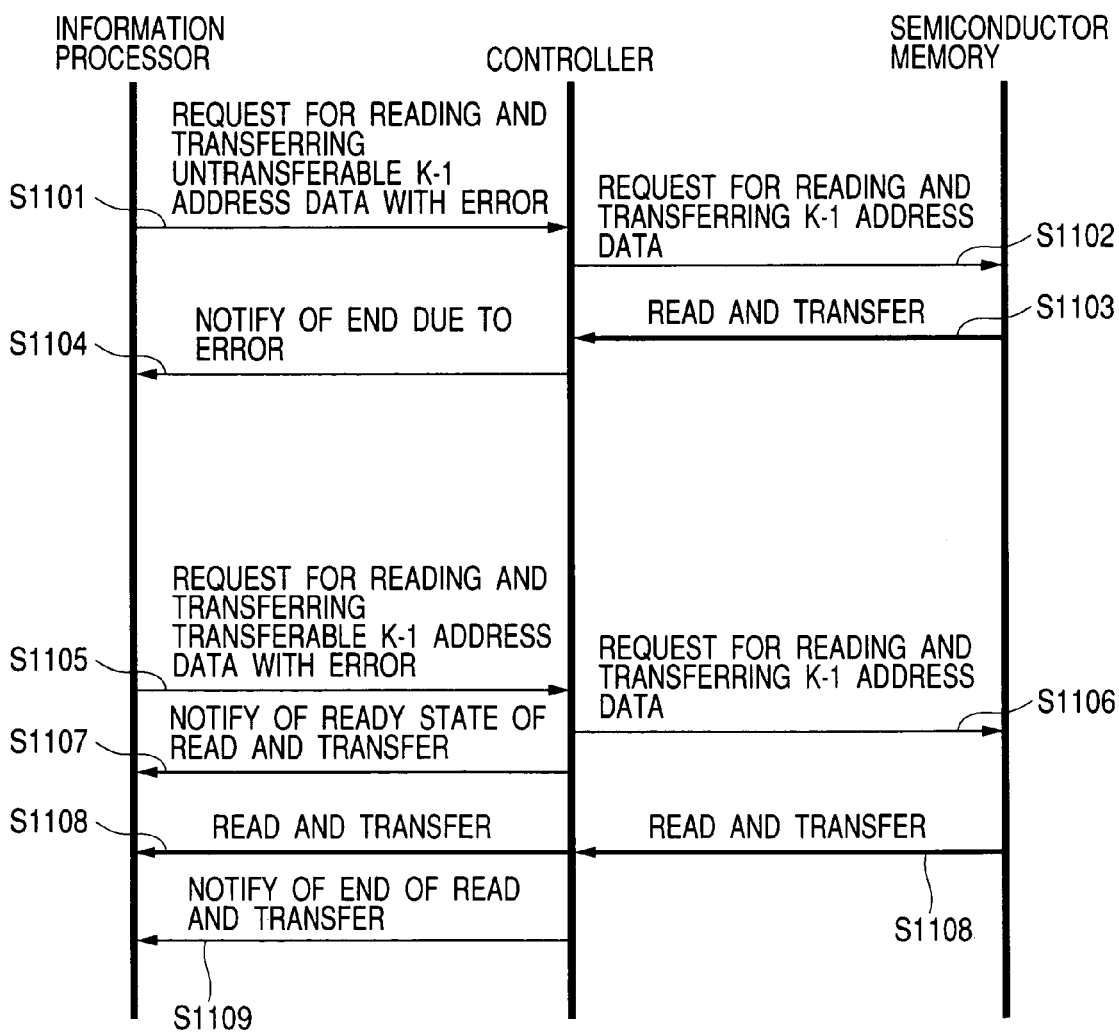
FIG. 32 is a flowchart showing an example of switching of the setting and transferring function by the data memory system according to the second embodiment of the invention.
Figure 33:
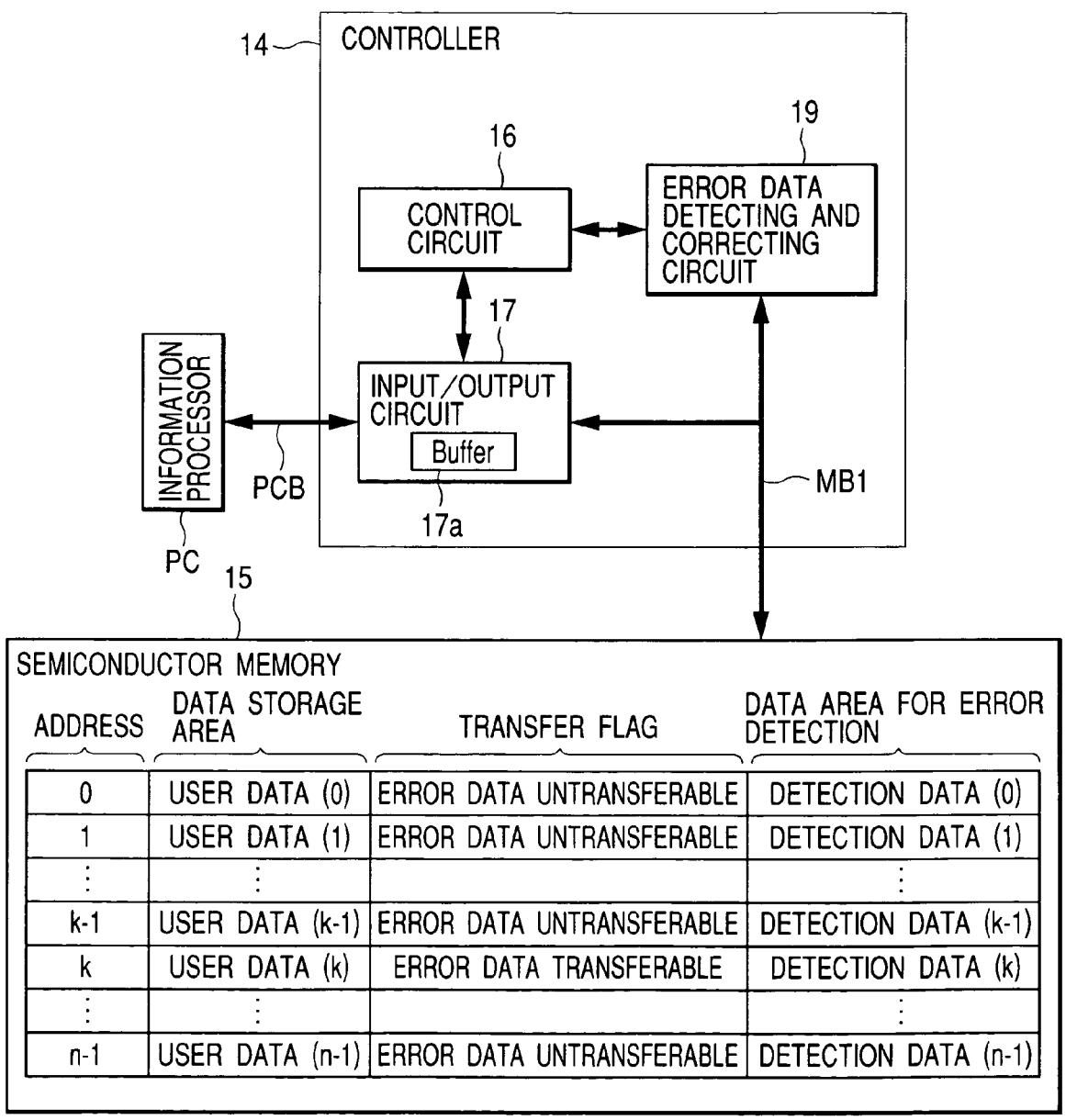
FIG. 33 is a block diagram of the data memory system which sets the transfer function setting data in the semiconductor memory according to the second embodiment of the invention.
Figure 34:
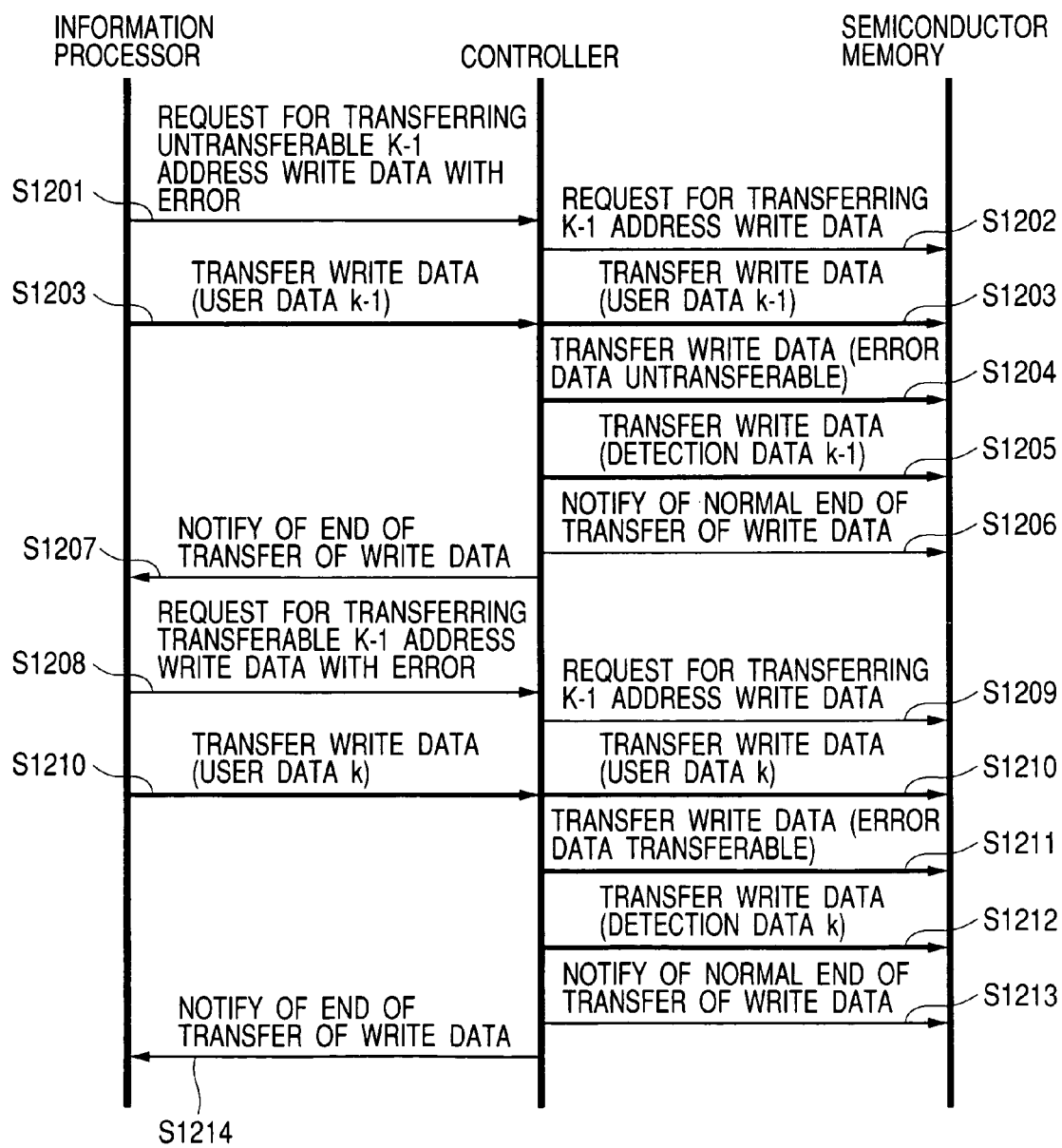
FIG. 34 is a flowchart of process of setting a transfer flag at the time of transfer of write data by the data memory system of FIG. 33.
Figure 35:
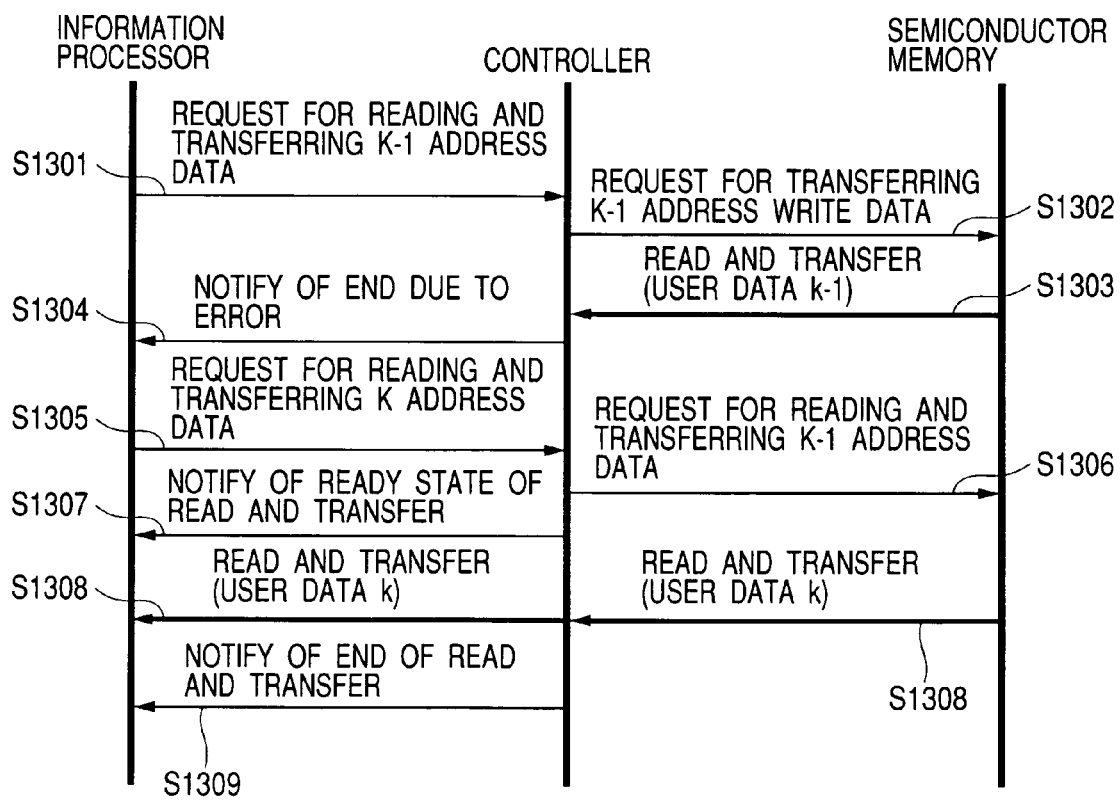
FIG. 35 is a flowchart showing a read/transfer process after the transfer mode is set in FIG. 34.

FIG. 22 is a block diagram of a data memory system according to a second embodiment of the invention. FIG. 23 is a flowchart of transfer of read data when an erroneous data transfer function is set to be valid in the data memory system of FIG. 22. FIG. 24 is a flowchart of transfer of read data when the erroneous data transfer function is set to be invalid in the data memory system of FIG. 22. FIG. 25 is a flowchart of transfer of read data when an erroneous data correcting and transferring function of transferring corrected data is set to be valid in the data memory system of FIG. 22. FIG. 26 is a flowchart of operation performed when a read and transfer request is made from a controller provided for the data memory system of FIG. 22. FIG. 27 is a flowchart showing another example of operation performed when a read and transfer request is made from the controller of FIG. 22. FIG. 28 is a flowchart showing an example of changing transfer function setting data by the data memory system according to the second embodiment of the invention. FIG. 29 is a flowchart showing another example of changing the transfer function setting data by the data memory system according to the second embodiment of the invention. FIG. 30 is a diagram illustrating an example of a data structure when transfer function setting data is set in a semiconductor memory provided for the data memory system according to the second embodiment of the invention. FIG. 31 is a diagram illustrating another example of the data structure when the transfer function setting data is set in the semiconductor memory provided for the data memory system according to the second embodiment of the invention. FIG. 32 is a flowchart showing an example of switching the setting and transferring function by the data memory system according to the second embodiment of the invention. FIG. 33 is a block diagram of the data memory system which sets the transfer function setting data in the semiconductor memory according to the second embodiment of the invention. FIG. 34 is a flowchart of process of setting a transfer flag at the time of transfer of write data by the data memory system of FIG. 33. FIG. 35 is a flowchart showing a read/transfer process after the transfer mode is set in FIG. 34.

In the second embodiment, a data memory system (memory system) 13 is a memory card constructed by using, for example, a flash memory and is used as an external storage medium of the information processor PC as a host. The information processor PC is, for example, a personal computer, a multifunctional peripheral, or the like.

The data memory system 13 is, as shown in FIG. 22, constructed by a controller (information processor) 14 and a semiconductor memory 15. Although one semiconductor memory 15 is used here, a plurality of semiconductor memories may be provided.

The controller 14 reads a program, data, and the like stored in the semiconductor memory 15 on the basis of an operation program and an instruction of the information processor PC and performs a predetermined process, an instruction for writing data, and the like.

The semiconductor memory 15 is, for example, a non-volatile semiconductor memory such as a flash memory. In a manner similar to the first embodiment, the semiconductor memory 15 is not limited to a flash memory but may be a memory capable of storing data such as SRAM (Static Random Access Memory), DRAM (Dynamic RAM), MRAM (Magnetoresistive RAM), EPROM (Erasable and Programmable Read Only Memory) or the like.

In the embodiment of the invention, the controller and the memory are separated from each other. Alternately, an embedded semiconductor obtained by forming the controller, the memory, and peripheral parts as one component may be used.

In the semiconductor memory 15, a data storage area and a data area for error detection are provided in correspondence with addresses (physical addresses) 0 to n. The data storage area is an area in which the user data (0) to (n) is stored. The data area for error detection is an area for storing ECCs in the user data (0) to (n).

The controller 14 and the semiconductor memory 15 are connected to each other via a semiconductor memory bus MB1. The information processor PC and the controller 14 are connected to each other via the information processor bus PCB.

The information processor bus PCB has a mechanical coupling means and may be of a contact type which is electrically connected or a non-contact type of transmitting information by an information transmission medium such as electric waves.

The controller 14 is constructed by a control circuit 16, an input/output circuit 17, a memory 18 for referring to transfer mode switching (transfer mode storing unit), and an error data detecting and correcting circuit (error data detecting and correcting unit) 19.

The control circuit 16 controls the input/output circuit 17, memory 18 for referring to transfer mode switching, and error data detecting and correcting circuit 19. The input/output circuit 17 has a data buffer 17a and controls transfer of data to/from the semiconductor memory 3 and the information processor PC.

The memory 18 for referring to transfer mode switching stores transfer function setting data for setting whether error data is to be transferred or not. The memory 18 for referring to transfer mode switching may be nonvolatile or volatile. The memory 18 may be a register constructed by using a random gate.

The error data detecting and correcting circuit 19 detects an error in transfer data by using an ECC or the like. An error may be detected not only by an ECC but also by a simple detecting function such as a CRC (Cyclic Redundancy Check) or a parity check.

The action of the data memory system 14 in the embodiment will now be described.

A process of transferring read data in a state where the error data transfer function is set to be valid in the memory 18 for referring to transfer mode switching will now be described by using the flowchart of FIG. 23. It is assumed here that user data (k−1) stored in an address k−1 in the semiconductor memory 13 is erroneous.

First, when the information processor PC sends a request for reading user data (k−1) to the controller 14 (step S401), the controller 14 sends the request for reading the user data (k−1) in the address k−1 to the semiconductor memory 15 (step S402) and notifies the information processor PC of transfer of read data (step S403)

By the notification of transfer of read data, the user data (k−1) in the semiconductor memory 15 is read and transferred to the information processor PC via the controller 14 (step S404). In this case, the error data transfer function is valid, so that all of the user data (k−1) including the error data is transferred.

When the transfer of the user data (k−1) is finished, the controller 14 notifies the information processor PC of the end of transfer of the read data (step S405). The end of transfer of read data is notified irrespective of whether the transfer is finished normally or abnormally.

The read data transfer process when the memory 18 for referring to transfer mode switching sets the error data transfer function to be invalid will be described by using the flowchart of FIG. 24. It is also assumed here that user data (k−1) stored in the address k−1 in the semiconductor memory 13 includes error data.

When the information processor PC sends a request for reading and transferring the user data (k−1) to the controller 14 (step S501), the controller 14 sends the request for reading and transferring the user data (k−1) in the address k−1 to the semiconductor memory 15 (step S502) and, after that, the user data (k−1) in the semiconductor memory 15 is read by the controller 14 (step S503). By the error data detecting and correcting circuit 19, an error data check is made.

When the error data detecting and correcting circuit 19 detects error data in the user data (k−1), the controller 14 notifies the information processor PC of the end due to the error (step S504).

A read data transfer process performed in a state where the memory 18 for referring to transfer mode switching sets the error data transfer function for correcting error data and transferring the corrected data to be valid will now be described by using the flowchart of FIG. 25. It is also assumed here that error data is included in the user data (k−1) stored in the address k−1 in the semiconductor memory 13.

When a request for reading user data (k−1) is sent from the information processor PC to the controller 14 (step S601), the controller 14 requests the semiconductor memory 15 to read and transfer the user data (k−1) in the address k−1 (step S602).

After that, the controller 14 reads the user data (k−1) in the semiconductor memory 15 (step S603) and the error data detecting and correcting circuit 19 checks the user data (k−1).

If error data is detected in the user data (k−1), the error data detecting and correcting circuit 19 corrects the error data, requests a transfer of write data to the semiconductor memory 15 (step S604), and rewrites the data with the corrected user data (k−1) (step S605).

The corrected user data (k−1) in FIG. 25 is written again into the address k−1. It is also possible to provide a spare area in the semiconductor memory and another semiconductor memory and replace the user data (k−1).

Subsequently, the controller 14 notifies the information processor PC of transfer of read data (step S606), and the corrected user data (k−1) is transferred (step S607).

After completion of the transfer of the user data (k−1), the controller 14 notifies the information processor PC of the end of transfer of the read data (step S608). In this case as well, the end of transfer of read data is notified irrespective of whether the transfer is finished normally or abnormally.

The operation of the controller 14 when the read and transfer request is made will now be described by using the flowchart of FIG. 26.

First, when a read and transfer request is sent from the information processor PC, the control circuit 16 refers to the transfer function setting data of the memory 18 for referring to transfer mode switching and determines whether even error data is transferred or not (step S701).

In the case of transferring even error data, data read from the semiconductor memory 15 is transferred as it is to the information processor PC (step S702).

In the case where error data is not transferred, data read from the semiconductor memory 15 is transferred to the error data detecting and correcting circuit 19 (step S703) and whether error data is included or not is checked (step S704).

In the case where error data is detected and is correctable (step S705), the error data detecting and correcting circuit 19 corrects the data and transfers the corrected data to the information processor PC (step S707)

If error data cannot be corrected (step S705), an untransferable state is notified to the information processor PC (step S706).

In this case, if the transfer function setting data is set to the function of transferring even error data, data is transferred without making an error data check, so that high-speed transfer process can be realized.

Another example of operation of the controller 14 when the read and transfer request is made will now be described by using the flowchart of FIG. 27.

First, when a read and transfer request is sent from the information processor PC, data is read from the semiconductor memory 15 and transferred to the error data detecting and correcting circuit 19 (step S801) and whether error data is included or not is checked (step S802).

If no error data is included, the read data is transferred to the information processor PC (step S803). If error data is included, when the data is correctable (step S804), the error data detecting and correcting circuit 19 corrects the data and transfers the corrected data to the information processor PC (step S805).

When the error data is not correctable (step S804) the control circuit 16 refers to the transfer function setting data in the memory 18 for referring to transfer mode switching and determines whether even error data is transferred or not (step S806).

In the case of transferring data even if the data includes error data, the data read from the semiconductor memory 15 is transferred as it is to the information processor PC (step S807). In the case where error data is not transferred, the controller 14 notifies the information processor PC of an untransferable state (step S808).

In this case, even when the transfer function setting data is set to the function of transferring even error data, transfer of error data is limited to the case where the data is uncorrectable, so that the reliability of data can be improved.

The case of changing the transfer function setting data in the memory 18 for referring to transfer mode switching by the information processor PC will now be described by using the flowchart of FIG. 28.

The case of changing a setting of transferring no error data to a setting of transferring error data at the time of data transfer will now be described.

For example, when a request for reading and transferring user data (k−1) is sent from the information processor PC (step S901), the controller 14 requests the semiconductor memory 15 to read and transfer the user data (k−1) (step S902).

Subsequently, data in the semiconductor memory 15 is read and transferred to the controller 14 (step S903).

Since the transferred user data (k−1) includes error data, the controller 14 notifies the information processor PC of end due to an error (step S904).

When the notification of end due to an error is transferred, the information processor PC requests the controller 14 to perform a mode switching process for changing the transfer function setting data (step S905) The controller 14 receives the mode switching process request, changes the transfer function setting data in the memory 18 for referring to transfer mode switching, and notifies the information processor PC of completion of change in the transfer function setting data (step S906).

Subsequently, the information processor PC makes the request of reading and transferring the user data (k−1) again (S907). The controller 14 sends the request of reading and transferring the user data (k−1) to the semiconductor memory 15 (step S908) and transfers the notification of transfer of read data to the information processor PC (step S909).

The data in the semiconductor memory 15 is read and transferred to the information processor PC via the controller 14 (step S910). After completion of transfer of all of the read data, the controller 14 notifies the information processor PC of end of transfer of the read data (step S911).

The transfer function setting data can be set not necessarily in the memory 18 for referring to transfer mode switching but can be set in, for example, the semiconductor memory 15.

Change in the transfer function setting data by the information processor PC in this case will now be described by using the flowchart of FIG. 29.

When a request for reading and transferring the user data (k−1) is sent from the information processor PC (step S1001), the controller 14 sends the request for reading and transferring the user data (k−1) to the semiconductor memory 15 (step S1002).

After that, data in the semiconductor memory 15 is read and transferred to the controller 14 (step S1003) Since the transferred user data (k−1) includes error data, the controller 14 notifies the information processor PC of end due to an error (step S1004).

By the notification of end due to an error, the information processor PC requests the controller 14 to perform a mode switching process of changing the transfer function setting data (step S1005). On reception of the mode switching process request, the controller 14 changes the transfer function setting data of the semiconductor memory 15 (step S1006) and notifies the information processor PC of completion of change in the transfer function setting data (step S1007).

The information processor PC sends the request for reading and transferring the user data (k−1) again (step S1008), and the controller 14 sends the request for reading and transferring the user data (k−1) to the semiconductor memory 15 (step S1009) and transfers the notification of transfer of read data to the information processor PC (step S1010).

The data in the semiconductor memory 15 is read and transferred to the information processor PC via the controller 14 (step S1011). When transfer of all of read data is finished, the controller 14 notifies the information processor PC of end of transfer of the read data (step S1012).

In the embodiment, a rewrite flag stored in the semiconductor memory is not checked every reading and transfer operation for the reason that a transfer flag is stored in the controller. Thus, the invention can be realized without deteriorating the performance of the reading and transferring operation from the information processor PC. A rewrite flag stored in the semiconductor memory is checked by the controller during the resetting process requested by the information processor PC during resetting after turn-on of the power. This method of storing the flag in the semiconductor memory can easily address a request from a customer at the time of shipping from a manufacturer. The information processor PC compatible with the customer does not have to be aware of switching of a mode.

FIG. 30 is a diagram illustrating a data structure in the case where the transfer function setting data in which the error data transfer function is invalid is set in the semiconductor memory 15. FIG. 31 is a diagram illustrating a data structure in the case where the transfer function setting data in which the error data transfer function is valid is set in the semiconductor memory 15.

As shown in FIGS. 30 and 31, the data storage area corresponding to the address "n" in the semiconductor memory 15 serves as an area for setting the transfer function setting data. When the transfer invalid flag is set in the area, the error data transfer function is made invalid. When the transfer valid flag is set, the error data transfer function is made valid.

The transfer function setting data is set in at least one of the semiconductor memories and may be used for a function setting of the whole memory system of the invention. Further, the transfer function setting data may be set in each semiconductor memory. By setting the data in each semiconductor memory, for example, by storing data for file management requiring relatively high data reliability and data such as image and sound data requiring relative high data transfer speed into different semiconductor memories, a memory system having high usability can be realized.

FIG. 32 is a flowchart of a process of switching the setting and transfer function by changing a command code at the time of a read and transfer request.

When the information processor PC makes a request for reading and transferring (k−1) address data while inhibiting error data by using a command code (step S1101), the controller 14 sends a request for reading and transferring the user data (k−1) to the semiconductor memory 15 (step S1102), and data read from the semiconductor memory 15 is transferred to the controller 14 (step S1103).

Since the transferred user data (k−1) includes error data, the controller 14 notifies the information processor PC of end due to an error (step S1104).

Subsequently, when the information processor PC sends a request for reading and transferring user data (k−1) while permitting error data by using a command code (step S1105), the controller 14 sends a request for reading and transferring the user data (k−1) to the semiconductor memory 15 (step S1106) and transfers notification of transfer of read data to the information processor PC (step S1107).

After that, data in the semiconductor memory 15 is read and transferred to the information processor PC via the controller 14 (step S1108). When transfer of all of read data is finished, the controller 14 notifies the information processor PC of end of the read data transfer (step S1109).

FIG. 33 is a diagram illustrating an example of the configuration of the semiconductor memory 15 in which the transfer function setting data can be set in each of user data (0) to (n−1).

In this case, the semiconductor memory 15 has not only a data storage area and a data area for data detection but also an area for storing a transfer flag for setting whether user data is transferred or not even if the user data is error data.

By setting an error data untransferable flag or an error data transferable flag in the transfer flag storing area, the memory for referring to transfer mode switching can be made unnecessary. Since whether error data is transferable or untransferable can be selectively set to each user data, reliability of the data storage can be improved.

A process of setting a transfer flag in the semiconductor memory 15 at the time of transfer of write data will now be described by using the flowchart of FIG. 34. It is assumed here that user data (k−1) is set to the error data transferable state, and user data (k) is set to the error data untransferable state.

The information processor PC sends a request for transferring user write data (k−1) while inhibiting error data by using a command code (step S1201), the controller 14 sends the request for transferring the user write data (k−1) to the semiconductor memory 15 (step S1202), and write data is transferred to the semiconductor memory 15 via the controller 14 (step S1203).

The controller 14 sets the transfer flag which inhibits transfer of error data in the semiconductor memory 15 (step S1204) and stores the detected user data (k−1) into the data area for error detection in the semiconductor memory 15 (step S1205).

Subsequently, the controller 14 notifies the semiconductor memory 15 of normal end of write transfer (step S1206) and notifies the information processor PC of end of the write transfer (step S1207).

When the information processor PC makes the request of transferring user write data (k) while permitting error data by using a command code (step S1208), the controller 14 sends a request for transferring the user write data (k) to the semiconductor memory 15 (step S1209) and the write data is transferred to the semiconductor memory 15 via the controller 14 (step S1210).

The controller 14 sets the error data transferable flag in the semiconductor memory 15 (step S1211) and stores detected user data (k) into the data area for error detection in the semiconductor memory 15 (step S1212).

Subsequently, the controller 14 notifies the semiconductor memory 15 of normal end of the transfer of write data (step S1213) and transfers a write data transfer end notification to the information processor PC (step S1214).

FIG. 35 is a flowchart showing a read and transfer process after the transfer mode is set in FIG. 34.

When the information processor PC makes a request for reading and transferring user data (k−1) (step S1301), the controller 14 sends the request for transferring the user write data (k−1) to the semiconductor memory 15 (step S1302). In response to the request, the read data is transferred to the controller 14 (step S1303).

Since the user data (k−1) includes error data, the controller 14 transfers an error end notification to the information processor PC (step S1304).

When the information processor PC sends again the request for reading and transferring the user data (k) (step S1305), the controller 14 sends the request for reading and transferring the user data (k) to the semiconductor memory 15 (step S1306) and sends the read and transfer request to the information processor PC (step S1307).

Although the user data k also includes error data, read data is transferred from the semiconductor memory 15 to the information processor PC via the controller 14 (step S1308). After all of read data is transferred, the controller 14 transfers a notification of end of the read and transfer to the information processor PC (step S1309).

In the second embodiment, user data can be transferred even it includes error data without interruption, so that unnecessary wait time can be eliminated.

Since data is transferred without interruption, a buffer of a large capacity becomes unnecessary for the information processor PC. Thus, reduction in the cost of the information processor PC can be realized.

Figure 36:
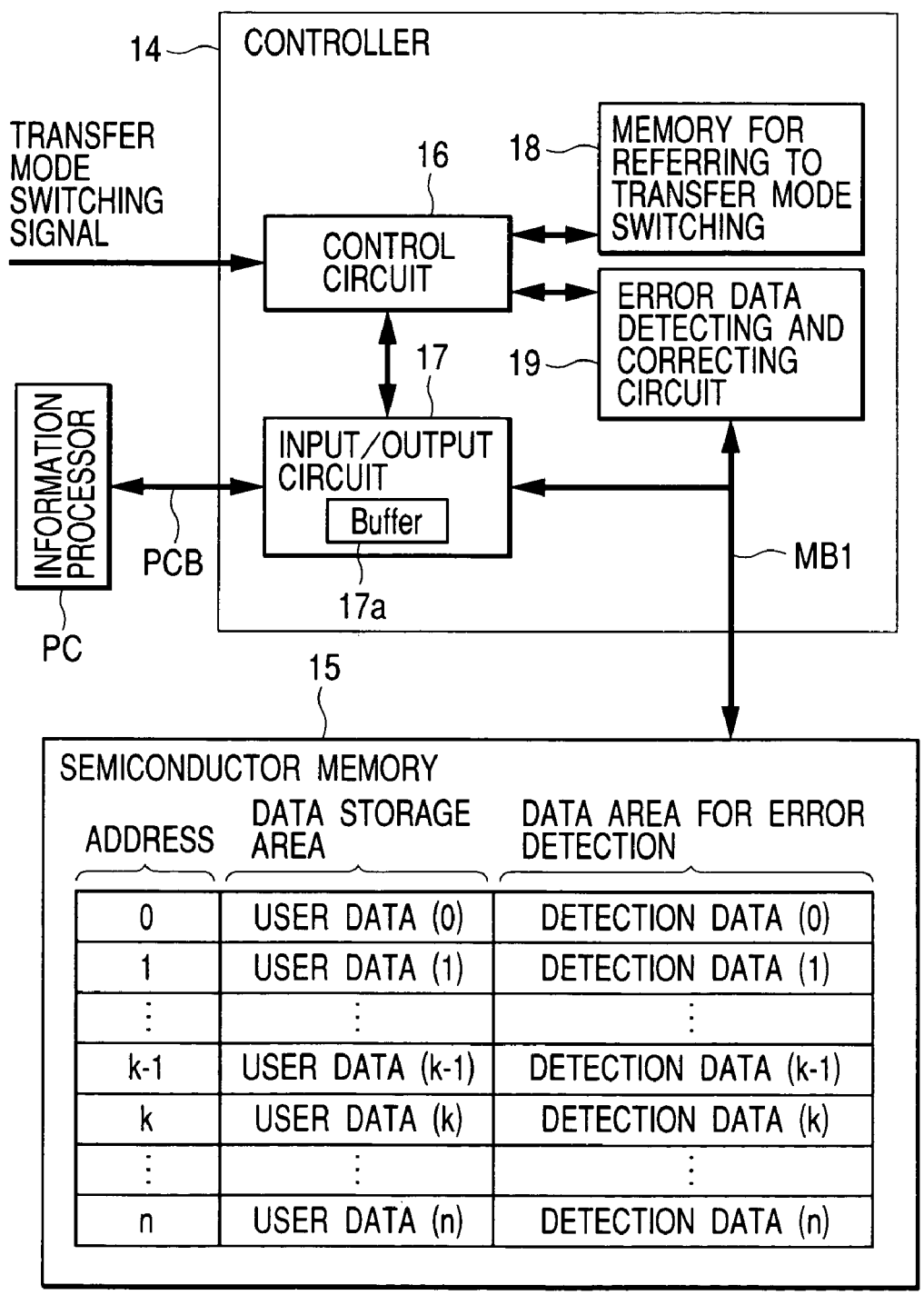
FIG. 36 is a block diagram of a data memory system according to another embodiment of the invention.

Further, in the second embodiment, the case of setting the error data transfer function by the information processor PC has been described. For example, as shown in FIG. 36, a transfer mode switching signal may be supplied from the outside other than the information processor PC to the control circuit 16 in the controller 14.

In the second embodiment, obviously, the error uncorrectable state is not limited to a state where an error cannot be corrected in reality but includes a case where an error cannot be corrected within predetermined time.

For example, by providing a register or the like in which error correction time can be set and designating the error correction time for each kind of data, each of data of which transfer time is more important than accuracy and data whose accuracy is more important can be transferred at proper speed.

In the second embodiment, in the case where error correction is impossible, data read from the memory array is supplied to the host without being subjected to error correction. In this case, it is obvious that, for example, all of data "0" or all of data "1" can be supplied to the host.

Effects obtained by representative ones of the inventions disclosed in the specification will be briefly described as follows.

(1) Even when an abnormal state occurs in the host, the power supply voltage, or the like during the data transfer process, transfer of error data, rewriting of data to error data, and the like can be prevented by the emergency stop requesting process, so that reliability of the data memory system can be improved.

(2) Since user data including error data can be also transferred without interruption, useless wait time can be reduced and reliability of the memory system can be further improved.

(3) Further, by the above effects (1) and (2), the performance and reliability of an electronic system constructed by using the memory system or the like can be largely improved.

What is claimed is:

1. A nonvolatile memory system comprising:
one or more semiconductor memories; and
an information processor for reading data stored in said one or more semiconductor memories, giving a data writing operation instruction or performing a predetermined process on the basis of an operation program,
wherein when an emergency stop signal is received from outside, said information processor stops an operation being performed and enters a no-response state in which no response is given to a subsequent process request from the outside.

2. The nonvolatile memory system according to claim 1, wherein the no-response state of said information processor is canceled by re-start of said nonvolatile memory system.

3. A nonvolatile memory system comprising:
one or more semiconductor memories; and
an information processor for reading data stored in said one or more semiconductor memories, giving a data writing operation instruction or performing a predetermined process on the basis of an operation program,
wherein said information processor includes:
a power supply voltage unit for generating an internal power supply voltage from an external power supply voltage and supplying the internal power supply voltage to said one or more semiconductor memories and said information processor;
a first voltage monitoring unit for outputting a power-on-reset signal when the internal power supply voltage generated by said power supply voltage unit reaches a first voltage level; and
a second voltage monitoring unit for outputting an emergency stop signal when the external power supply voltage reaches a second voltage level, and
wherein when the emergency stop signal output from said second voltage monitoring unit is received, said information processor stops an operation being performed and enters a no-response state in which no response is given to a process request from outside, and when the power-on-reset signal output from said first voltage monitoring unit is received, said information processor performs a resetting process.

4. A nonvolatile memory system comprising:

one or more semiconductor memories; and an information processor for reading data stored in said one or more semiconductor memories, giving a data writing operation instruction or performing a predetermined process on the basis of an operation program, wherein said information processor includes:

a power supplying unit for supplying an auxiliary power supply voltage;

a power supply switching unit for outputting an emergency stop signal when an external power supply voltage reaches a first voltage level, switching said external power supply voltage to the power supply voltage of said power supplying unit and supplying the power supply voltage to said one or more semiconductor and said information processor; and a first voltage monitoring unit for outputting a power-on-reset signal when said external power supply voltage reaches a second voltage level, wherein when the emergency stop signal output from said power supply switching unit is received, said information processor stops an operation being performed and enters a no-response state in which no response is given to a process request from outside, and when the power-on-reset signal which is output from said first voltage monitoring unit is received, said information processor performs a resetting process.

5. The nonvolatile memory system according to claim 4, wherein when said emergency stop signal is received during a data transfer process in a reading or writing operation, said information processor finishes the data transfer process safely, and thereafter enters said no-response state.

6. The nonvolatile memory system according to claim 5, wherein in said no-response state, said information processor notifies a host which is externally connected of either an end, an error, or a busy state.

7. A nonvolatile memory system comprising:

one or more semiconductor memories; and an information processor for reading data stored in said one or more semiconductor memories, giving a data writing operation instruction or performing a predetermined process on the basis of an operation program, wherein said information processor has a transfer mode storing unit for storing transfer function setting data for setting a transfer mode of error data, refers to the transfer function setting data in said transfer mode storing unit in a data transfer process at the time of a read operation or a write operation and, when an error data transfer function of said transfer function setting data is set to be valid, executes a transfer process even if transfer data includes error data.

8. The nonvolatile memory system according to claim 7, wherein said transfer mode storing unit takes the form of a register, and said transfer function setting data is set by a command which is received from outside.

9. The nonvolatile memory system according to claim 7, wherein said transfer mode storing unit is a memory area as a part of said one or more semiconductor memories, and wherein said information processor refers to the transfer function setting data stored in the memory area in said one or more semiconductor memories at the time of data transfer and, in the case where an error data transfer function is set to be valid, executes a transfer process even if transfer data includes error data.

10. The nonvolatile memory system according to claim 8, wherein said information processor has an error data detecting and correcting unit for correcting error data, and wherein said error data detecting and correcting unit detects whether error data is included in said transfer data or not, if error data is included in said transfer data and said error data is correctable, corrects said error data and transfers the corrected data and, if said error data is uncorrectable, said error detecting and correcting unit transfers said error data without correcting it.

11. A nonvolatile memory system comprising:

one or more semiconductor memories; and an information processor for reading data from said one or more semiconductor memories, giving a data writing operation instruction or performing a predetermined process on the basis of an operation program, wherein an error determining unit is provided for determining whether an error is included in the data read from said one or more semiconductor memories at a time of reading the data from said one or more semiconductor memories, and wherein the nonvolatile memory system has a first reading operation for determining whether an error is included in the data read from said one or more semiconductor memories and outputting the data, and a second reading operation for outputting the data read from said one or more semiconductor memories without determining whether an error is included.

12. The nonvolatile memory system according to claim 11, wherein said error determining unit has an error correcting function, and wherein, in a case where it is determined that an error is included in the data read from said one or more semiconductor memories in said first reading operation, the error is corrected by said error correcting function.

13. The nonvolatile memory system according to claim 12, wherein in said first reading operation, when an error detected in the data read from said one or more semiconductor memories can be corrected by said error correcting function, said error determining unit corrects the error and, when an error is uncorrectable within a predetermined time, said error determining unit does not correct the error.

14. The nonvolatile memory system according to claim 13, wherein in said first reading operation, when an error which cannot be corrected within a predetermined time is detected in the data read from said one or more semiconductor memories, said error determining unit outputs the data read from said one or more semiconductor memories without correcting the error.

* * * * *